United States Patent
Kim

(10) Patent No.: US 11,910,590 B2
(45) Date of Patent: Feb. 20, 2024

(54) MEMORY CELL AND SEMICONDUCTOR MEMORY DEVICE WITH THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 288 days.

(21) Appl. No.: 17/368,376

(22) Filed: Jul. 6, 2021

(65) Prior Publication Data

US 2022/0246619 A1    Aug. 4, 2022

(30) Foreign Application Priority Data

Feb. 1, 2021    (KR) ........................ 10-2021-0014052

(51) Int. Cl.
*H01L 27/108* (2006.01)
*H01L 29/786* (2006.01)
*H10B 12/00* (2023.01)

(52) U.S. Cl.
CPC ......... *H10B 12/30* (2023.02); *H01L 29/7869* (2013.01); *H01L 29/78618* (2013.01); *H01L 29/78684* (2013.01); *H01L 29/78696* (2013.01); *H10B 12/50* (2023.02)

(58) Field of Classification Search
CPC ...... H10B 12/30; H10B 12/50; H10B 12/488; H10B 12/03; H01L 29/78618; H01L 29/78684; H01L 29/7869; H01L 29/78696
USPC ........................................................ 257/43
See application file for complete search history.

(56) References Cited

U.S. PATENT DOCUMENTS

| | | | |
|---|---|---|---|
| 2014/0203363 A1* | 7/2014 | Adam | H01L 29/41783 438/151 |
| 2022/0013524 A1* | 1/2022 | Ryu | H01L 27/13 |
| 2022/0122976 A1* | 4/2022 | Kim | H10B 12/30 |

* cited by examiner

*Primary Examiner* — Tong-Ho Kim
(74) *Attorney, Agent, or Firm* — IP & T GROUP LLP

(57) ABSTRACT

The present invention provides a highly integrated memory cell and a semiconductor memory device including the same. According to the present invention, a semiconductor memory device comprises: a substrate; an active layer spaced apart from the substrate, extending in a direction parallel to the substrate, and including a thin-body channel; a bit line extending in a direction vertical to the substrate and connected to one side of the active layer; a capacitor connected to another side of the active layer; and a first word line and a second word line extending in a direction crossing the thin-body channel with the thin-body channel interposed therebetween, wherein a thickness of the thin-body channel is smaller than thicknesses of the first word line and the second word line.

23 Claims, 29 Drawing Sheets

MEMORY CELL AND SEMICONDUCTOR MEMORY DEVICE WITH THE SAME

CROSS-REFERENCE TO RELATED APPLICATIONS

The present application claims priority to Korean Patent Application No. 10-2021-0014052, filed on Feb. 1, 2021, which is herein incorporated by reference in its entirety.

BACKGROUND

1. Field

The present disclosure relates to a semiconductor device and, more particularly, to a memory cell or a semiconductor device including the same.

2. Description of the Related Art

Integration degree of two-dimensional semiconductor memory devices is mainly determined by the area occupied by unit memory cells. Thus, the integration degree is hugely affected by the level of technology for forming microscopic patterns. The integration degree of two-dimensional semiconductor memory devices is still increasing. The increase is limited, however, because highly expensive tools are required for refining patterns. Accordingly, three-dimensional (3D) semiconductor memory devices having memory cells arranged 3-dimensionally are being suggested.

SUMMARY

Embodiments of the present disclosure provide highly integrated memory cells and semiconductor memory devices including the same.

According to an embodiment of the present invention, a semiconductor memory device comprises a substrate, an active layer spaced apart from the substrate, extending in a direction parallel to the substrate, and including a thin-body channel, a bit line extending in a direction vertical to the substrate and connected to one side of the active layer, a capacitor connected to another side of the active layer, and a first word line and a second word line extending in a direction crossing the thin-body channel with the thin-body channel interposed therebetween, wherein a thickness of the thin-body channel is smaller (i.e., thinner) than thicknesses of the first word line and the second word line.

According to an embodiment, a semiconductor memory device comprises a substrate, and a memory cell array including memory cells stacked along a direction vertical to the substrate, wherein each of the memory cells comprises: a bit line vertically oriented to the substrate; a capacitor laterally spaced apart from the bit line; an active layer laterally oriented between the bit line and the capacitor; and a word line disposed on an upper portion of the active layer and laterally oriented to intersect with the active layer, wherein the active layer includes a thin-body channel, a thickness of the thin-body channel is being thinner than a thickness of the word line.

According to an embodiment, a semiconductor memory device comprises a substrate, and a three-dimensional memory cell array of memory cells disposed on an upper portion of the substrate, wherein each of the memory cells of the three-dimensional memory cell array includes a transistor, the transistor includes a thin-body channel oriented parallel to a surface of the substrate and first and second word lines facing each other with the thin-body channel interposed therebetween, and a thickness of the thin-body channel is thinner than thickness of the first and second word lines.

The present disclosure includes vertically stacked active layers including thin-body channels. Therefore, refresh characteristics can be improved by improving the floating body effect (FBE).

DETAILED DESCRIPTION

Figure 1:
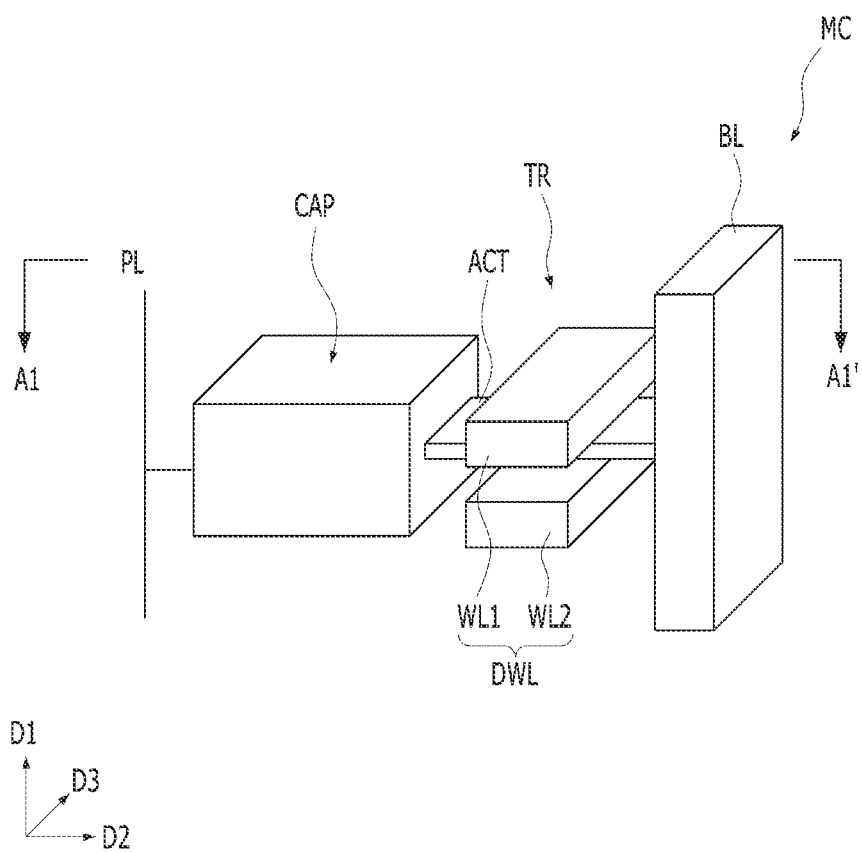
FIG. 1 is a schematic perspective view of a unit memory cell of a semiconductor memory device according to an embodiment of the present invention.

Various embodiments described herein will be described with reference to cross-sectional views, plane views and block diagrams, which are ideal schematic views of the present invention. Therefore, the structures of the drawings may be modified by fabricating technology and/or tolerances. The embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention.

Embodiments described hereafter may increase memory cell density by vertically stacking memory cells and decrease parasite capacitance.

Figure 2A:
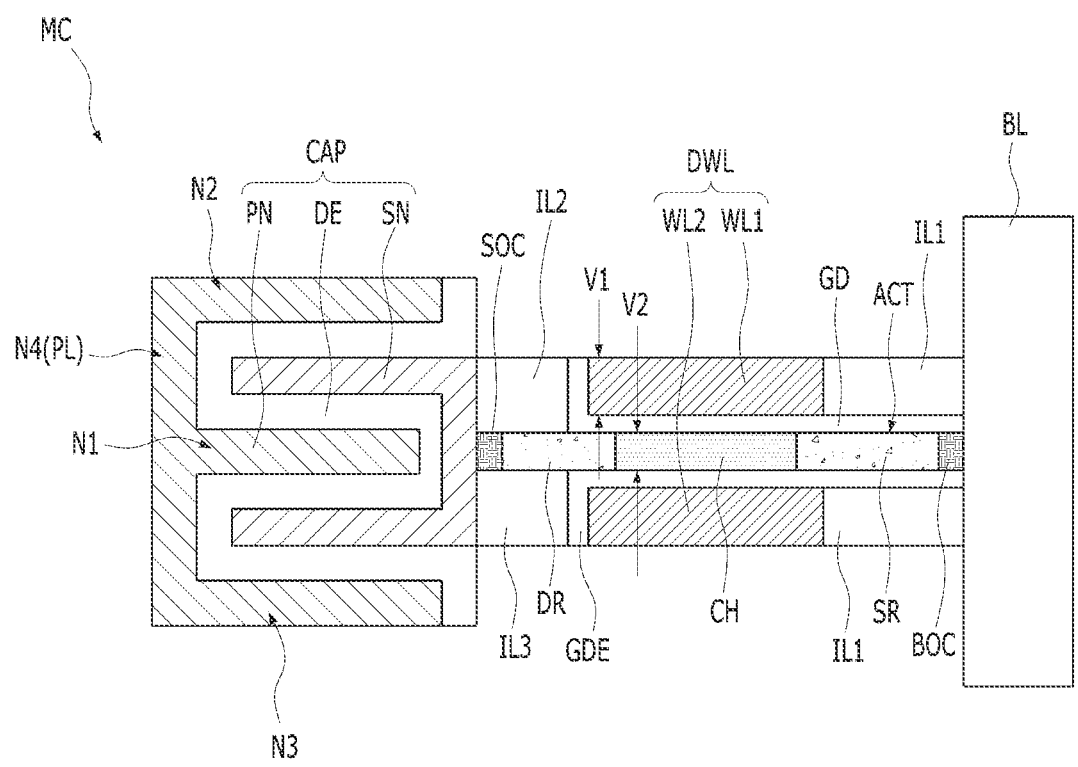
FIG. 2A is a cross-sectional view of the semiconductor memory device taken along a line A1-A1' of FIG. 1.
Figure 2A:
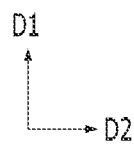
Figure 2B:
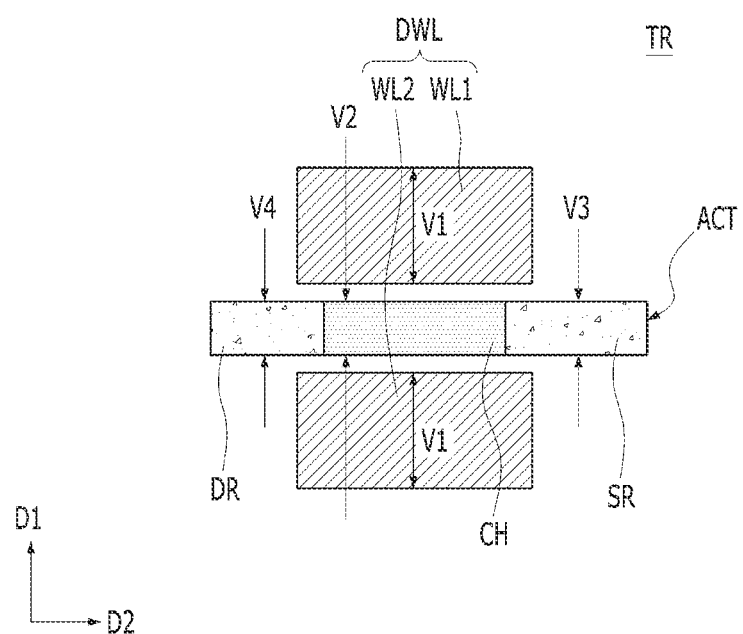
FIG. 2B is an enlarged view of a transistor TR.

FIG. 1 is a schematic perspective view of a unit memory cell of a semiconductor memory device according to an embodiment of the present invention. FIG. 2A is a cross-sectional view of the semiconductor memory device taken along a line A1-A1' of FIG. 1. FIG. 2B is an enlarged view of a transistor TR.

Referring to FIGS. 1, 2A, and 2B, a unit memory cell MC of a 3D semiconductor memory device according to an embodiment of the present invention may include a bit line BL, a transistor TR, and a capacitor CAP. The transistor TR may include an active layer ACT, a gate dielectric layer GD, and a double word line DWL. The capacitor CAP may include a storage node SN, a dielectric layer DE, and a plate node PN. The bit line BL may have a pillar-shape extending in a first direction D1. The active layer ACT may have a bar-shape extending in a second direction D2 intersecting with the first direction D1. The double word line DWL may have a line-shape extending in a third direction D3 intersecting with both the first direction D1 and the second direction D2. The plate node PN of the capacitor CAP may be connected to a plate line PL.

The bit line BL may be vertically oriented along the first direction D1. The bit line BL may be referred to as a vertically oriented bit line or a pillar-shape bit line. The bit line BL may include a conductive material. The bit line BL may include a silicon-base material, a metal-base material, or a combination thereof. The bit line BL may include, for example, polysilicon, metal, metal nitride, metal silicide, or a combination thereof. The memory cells MC, which are vertically stacked, may share a single bit line BL. For example, the bit line BL may include polysilicon, titanium nitride (TiN), tungsten, or a combination thereof. For example, the bit line BL may include polysilicon doped with N-type impurities or titanium nitride (TiN). The bit line BL may include a stack of titanium nitride and tungsten (TiN/W).

The transistor TR may include the active layer ACT, the gate dielectric layer GD, and the double word line DWL. The DWL may be extended in the third direction D3, and the active layer ACT may be extended in the second direction D2. The active layer ACT may be laterally arranged from the bit line BL. The double word line DWL may include a first word line WL1 and a second word line WL2. The first word line WL1 and the second word line WL2 may face each other with the active layer ACT interposed therebetween. The gate dielectric layer GD may be formed on upper and lower surfaces of the active layer ACT. The gate dielectric layer GD may include a gate dielectric layer extension GDE that covers the sides of the double word line DWL, for example, the sides adjacent to a second source/drain region DR.

The active layer ACT may include a semiconductor material or oxide semiconductor. For example, the active layer ACT may include silicon, germanium, silicon-germanium, or indium gallium zinc oxide (IGZO). The active layer ACT may include a thin-body channel CH, a first source/drain region SR between the thin-body channel CH and the bit line BL, the second source/drain region DR between the thin-body channel CH and the capacitor CAP.

Both the first source/drain region SR and the second source/drain region DR may be doped with a same conductive impurity. The first source/drain region SR and the second source/drain region DR may be doped with an N-type impurity or a P-type impurity. The first source/drain region SR and the second source/drain region DR may include at least any one impurity selected from among arsenic (AS), phosphorus (P), boron (B), indium (IN), or a combination thereof. A first side of the first source/drain region SR may be connected to the bit line BL. A second side of the first source/drain region SR may be connected to the thin-body channel CH. A first side of the second source/drain region DR may be connected to the storage node SN. A second side of the second source/drain region DR may be connected to the thin-body channel CH. The second side of the first source/drain region SR and the second side of the second source/drain region DR may partially overlap with a side of the first word line WL1 and a side of the second word line WL2, respectively. A lateral length of the thin-body channel CH along the second direction D2 may be shorter than the lateral length of each of the first and second source/drain regions SR and DR along the second direction D2. In an embodiment, a lateral length of the thin-body channel CH along the second direction D2 may be longer than the lateral length of each of the first and second source/drain regions SR and DR along the second direction D2. A bit line side-ohmic contact BOC may be formed between the first source/drain region SR and the bit line BL. The bit line side-ohmic contact BOC may be formed by a reaction between metal of the bit line BL and the silicon of the first source/drain region SR. The bit line side-ohmic contact BOC may include metal silicide and may be formed on an edge of the active layer ACT, which is the first side of the first source/drain region SR. A storage node side-ohmic contact SOC may be formed between the second source/drain region DR and the storage node SN. The storage node side-ohmic contact SOC may include metal silicide and may be formed on another edge of the active layer ACT, which is the first side of the second source/drain region DR. The storage node side-ohmic contact SOC may be formed by a reaction between a metal of the storage node SN and the silicon of the second source/drain region DR.

The gate dielectric layer GD may include silicon oxide, silicon nitride, metal oxide, metal oxynitride, metal silicate, a high-k material, a ferroelectric material, anti-ferroelectric material, or a combination thereof. The gate dielectric layer GD may include silicon oxide ($SiO_2$), silicon nitride ($Si_3N_4$), hafnium (IV) oxide ($HfO_2$), aluminum oxide ($Al_2O_3$), zirconium oxide ($ZrO_2$), aluminum oxynitride (AlON), hafnium oxynitride (HfON), hafnium silicate (HfSiO), hafnium silicon oxynitride (HfSiON), and so on.

The double word line DWL may include metal, metal mixture, metal alloy, or a semiconductor material. The double word line DWL may include titanium nitride, tungsten, polysilicon, or a combination thereof. For example, the double word line DWL may include a TiN/W stack in which titanium nitride and tungsten are stacked in the recited order. The double word line DWL may include a N-type workfunction material or a P-type workfunction material. The N-type workfunction material may have a low workfunction of 4.5 or less, and the P-type workfunction material may have a high workfunction of 4.5 or more.

The capacitor CAP may be laterally disposed from the transistor TR along the second direction D2. The capacitor CAP may include the storage node SN, which is laterally extended from the active layer ACT along the second direction D2. The capacitor CAP may further include the dielectric layer DE formed on the storage node SN and the plate node PN formed on the dielectric layer DE. The storage node SN, the dielectric layer DE, and the plate node PN may be laterally arranged along the second direction D2. The storage node SN may have a laterally oriented cylinder-shape. The dielectric layer DE may conformally cover both a cylinder inner wall and a cylinder outer wall of the storage node SN. The plate node PN may have a shape extending to the cylinder inner wall and the cylinder outer wall of the storage node SN formed on the dielectric layer DE. The plate node PN may be connected to the plate line PL. The storage node SN may be electrically connected to the second source/drain region DR and the storage node side-ohmic contact SOC. In an embodiment, the plate node PN together with the plate line PL may have an "E" shape as shown in the cross-sectional view of FIG. 2A.

The storage node SN may have a 3D structure. The storage node SN of a 3D structure may have a lateral 3D structure that is laterally oriented along the second direction D2. As an example of a 3D structure, the storage node SN may have a cylinder-shape. In an embodiment, the storage node SN may have a pillar-shape or a pylinder-shape. The pylinder shape may refer to a structure in which a pillar shape and a cylinder shape are merged. The uppermost surface of the storage node SN may be at the same level with the top surface of the first word line WL1. The lowermost surface of the storage node SN may be at the same level with the bottom surface of the second word line WL2.

The plate node PN may include an inner node N1 and outer nodes N2, N3, and N4. The inner node N1 and the outer nodes N2 to N4 may be interconnected. The inner node N1 may be disposed inside the cylinder of the storage node SN. The outer nodes N2 and N3 may be disposed outside the cylinder of the storage node SN with the dielectric layer DE interposed therebetween. The outer node N4 may interconnect the inner node N1 and the outer nodes N2 and N3. The outer nodes N2 and N3 may be disposed to surround the outer wall of the storage node SN. The outer node N4 may perform as the plate line PL.

The storage node SN and the plate node PN may include metal, noble metal, metal nitride, conductive metal oxide, conductive noble metal oxide, metallic carbide, metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium (IV) oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The plate node PN may include a combination of a metal-base material and a silicon-base material. For example, the plate node PN may be of a titanium nitride/silicon germanium/tungsten nitride (TiN/SiGe/WN) stack. In the titanium nitride/silicon germanium/tungsten nitride (TiN/SiGe/WN) stack, silicon germanium (SiGe) may be a gap-fill material filling inside the cylinder of the storage node SN, titanium nitride (TiN) may perform as the plate node PN of the capacitor CAP, and tungsten nitride (WN) may be a low-resistance material.

The dielectric layer DE may include silicon oxide, silicon nitride, a high-k material, or a combination thereof. A high-k material may have a higher dielectric constant than silicon oxide. In an embodiment, Silicon oxide ($SiO_2$) may have a dielectric constant of about 3.9, and the dielectric layer DE may include a high-k material having a dielectric constant of 4 or more. In an embodiment, the high-k material may have a dielectric constant of about 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In an embodiment, the dielectric layer DE may be formed of a composite layer including two or more layers of the high-k materials mentioned above.

The dielectric layer DE may be formed of zirconium (Zr)-base oxide. The dielectric layer DE may have a stack structure including zirconium oxide ($ZrO_2$). The stack structure including zirconium oxide ($ZrO_2$) may include a ZA ($ZrO_2/Al2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked in the recited order. The ZA and ZAZ stacks may be referred to as a zirconium oxide ($ZrO_2$)-base layer. In an embodiment, the dielectric layer DE may be formed of hafnium (Hf)-base oxide. The dielectric layer DE may have a stack structure including hafnium oxide ($HfO_2$). The stack structure including hafnium oxide ($HfO_2$) may include a HA ($HfO_2/Al_2O_3$) stack or a HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium (IV) oxide ($HfO_2$) are sequentially stacked in the recited order. The HA and HAH stacks may be referred to as a hafnium oxide ($HfO_2$)-base layer. Aluminum oxide ($Al_2O_3$) may have a higher band gap than zirconium oxide ($ZrO_2$) and hafnium (IV) oxide ($HfO_2$) in the ZA stack, ZAZ stack, HA stack, and HAH stack. Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material having a greater band gap than that of the high-k material. The dielectric layer DE may include silicon oxide ($SiO_2$) as a high band gap material other than aluminum oxide ($Al_2O_3$). Since the dielectric layer DE contains a high band gap material, leakage current may be suppressed. The high band gap material may be thinner than a high-k material. In an embodiment, the dielectric layer DE may include a laminated structure in which a high-k material and a high band gap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/$ $HfO_2$) stack. In the laminated structures as recited above, aluminum oxide ($Al_2O_3$) may be thinner than zirconium oxide ($ZrO_2$) and hafnium oxide ($HfO_2$).

In an embodiment, the dielectric layer DE may include a stack structure, a laminated structure, or an intermixing structure including zirconium oxide, hafnium oxide, and aluminum oxide.

In an embodiment, an interface control layer for improving leakage current may be further formed between the storage node SN and the dielectric layer DE. The interface control layer may include titanium oxide ($TiO_2$). The interface control layer may also be formed between the plate node PN and the dielectric layer DE.

The capacitor CAP may include a metal-insulator-metal (MIM) capacitor. The storage node SN and the plate node PN may include a metal-base material.

The capacitor CAP may be replaced with other data saving materials. For example, the data saving materials may include a phase change material, a magnetic tunnel junction material, or a variable resistor material.

An oxide-base dielectric layer IL1 may be formed between the bit line BL and the double word line DWL. The oxide-base dielectric layer IL1 may include silicon oxide.

A nitride-base dielectric layer IL2 and a carbon-containing dielectric layer IL3 may be formed between the double word line DWL and the storage node SN. The nitride-base dielectric layer IL2 may include silicon nitride. The carbon-containing dielectric layer IL3 may include silicon carbon nitride (SiCN), silicon carbon oxide (SiCO), or a combination thereof. The nitride-base dielectric layer IL2 may be formed between the first word line WL1 and the storage node SN. The carbon-containing dielectric layer IL3 may be formed between the second word line WL2 and the storage node SN. The carbon-containing dielectric layer IL3 may have an etch selectivity with respect to the oxide-base dielectric layer IL1 and the nitride-base dielectric layer IL2. In other words, the carbon-containing dielectric layer IL3 may be used as an etch stop layer.

Referring to FIGS. 2A and 2B again, the transistor TR is a cell transistor, and thus may have the double word line DWL. In the double word line DWL, the first word line WL1 and the second word line WL2 may have the same potential. For example, the first word line WL1 and the second word line WL2 may form a single pair and drive the memory cell MC. An equal word line driving voltage may be applied to the first and second word lines WL1 and WL2. That is, the unit memory cell MC according to an embodiment of the present invention may include the double word line DWL that the first and second word lines WL1 and WL2 are adjacent to the single thin-body channel CH.

In an embodiment, the first word line WL1 and the second word line WL2 may have different potentials. For example, a word line driving voltage may be applied to the first word line WL1, and a reference voltage, e.g., a ground voltage may be applied to the second word line WL2. The second word line WL2 may be referred to as a back word line or a shield word line. In an embodiment, the reference voltage, e.g., the ground voltage may be applied to the first word line WL1, and word line driving voltage may be applied to the second word line WL2.

Each of the first and second word lines WL1 and WL2 may have a first thickness V1, the first thickness V1 being measured in a direction parallel to the first direction D1. The active layer ACT may have a second thickness V2, the second thickness V2 being measured in a direction parallel to the first direction D1. The first and second thicknesses V1 and V2 may refer to a vertical thickness. The second thickness V2 may be smaller than the first thickness V1. A thickness of the active layer ACT may be smaller than that of the first and second word lines WL1 and WL2. The active layer ACT may be referred to as a thin-body active layer.

The thin-body channel CH may have the second thickness V2, the second thickness being measured in a direction parallel to the first direction D1. The second thickness V2 of the thin-body channel CH may be smaller than the thickness of the first and second word lines WL1 and WL2. The second thickness V2 of the thin-body channel CH may be larger (i.e., thicker) than the thickness of the gate dielectric layer GD. The thin-body channel CH and the gate dielectric layer GD may have the same thickness.

The first source/drain region SR may have a third thickness V3, the third thickness V3 being measured in a direction parallel to the first direction D1. The second source/drain region DR may have a fourth thickness V4, the fourth thickness V4 being measured in a direction parallel to the first direction D1. The third thickness V3 of the first source/drain region SR, the fourth thickness V4 of the second source/drain region DR, and the second thickness V2 of the thin-body channel CH may be the same. The third thickness V3 of the first source/drain region SR and the fourth thickness V4 of the second source/drain region DR may be smaller than the first thickness V1 of the first and second word lines WL1 and WL2.

The second thickness V2 of the thin-body channel CH may be equal to or less than 7 nm. The third thickness V3 of the first source/drain region SR and the fourth thickness V4 of the second source/drain region DR may be equal to or less than 7 nm. In an embodiment, the third thickness V3 of the first source/drain region SR and the fourth thickness V4 of the second source/drain region DR may be smaller than the first thickness V1 of the first and second word lines WL1 and WL2, but larger than the second thickness V2 of the thin-body channel CH.

Upper and lower surfaces of the active layer ACT may have a flat-surface. That is, the upper and lower surfaces of the active layer ACT may be parallel to each other along the second direction D2.

Figure 2C:
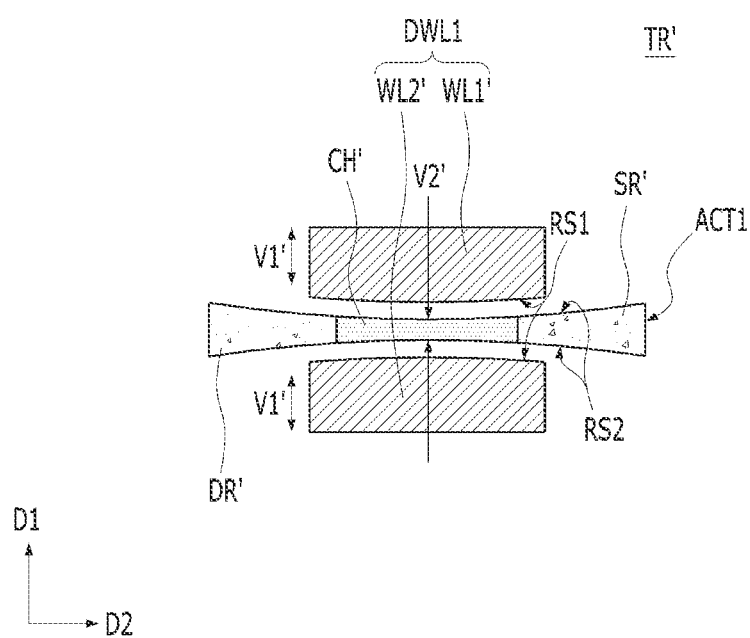
FIG. 2C is a modified example of a transistor TR'.

FIG. 2C illustrates a modified example of the transistor of FIG. 2B.

Referring to FIG. 2C, a transistor TR' may include an active layer ACT1 and a double word line DWL1. The double word line DWL1 may include a first word line WL1' and a second word line WL2' facing each other with the active layer ACT1 interposed therebetween. The active layer ACT1 may include a thin-body channel CH', a first source/drain region SR' on one side of the thin-body channel CH', and a second source/drain region DR' on another side of the thin-body channel CH'.

Each of the first and second word lines WL1' and WL2' of the double word line DWL1 may include a first curved surface also referred to as a round surface RS1, and the active layer ACT1 may include a second curved surface also referred to as a round surface RS2. The first round surface RS1 and the second round surface RS2 may face each other. A gate dielectric layer may be formed between the double word line DWL1 and the active layer ACT1.

Comparing thicknesses measured in a direction parallel to the first direction D1, an edge thickness V1' of the first word line WL1' and the second word line WL2' may be larger than a central thickness V2' of the thin-body channel CH'. An average thickness of the thin-body channel CH' may be smaller than an average thickness of the first word line WL1' and an average thickness of the second word line WL2'. The average thickness of the thin-body channel CH' may be equal to or less than 7 nm. An average thickness of the first source/drain region SR' and an average thickness of the second source/drain region DR' may be larger than the average thickness of the thin-body channel CH', but thinner than the average thickness of the first word line WL1' and the average thickness of the second word line WL2'. Here, the average thickness of a feature may refer to an average value between the thickest portion and the thinnest portion of the feature.

Figure 3A:
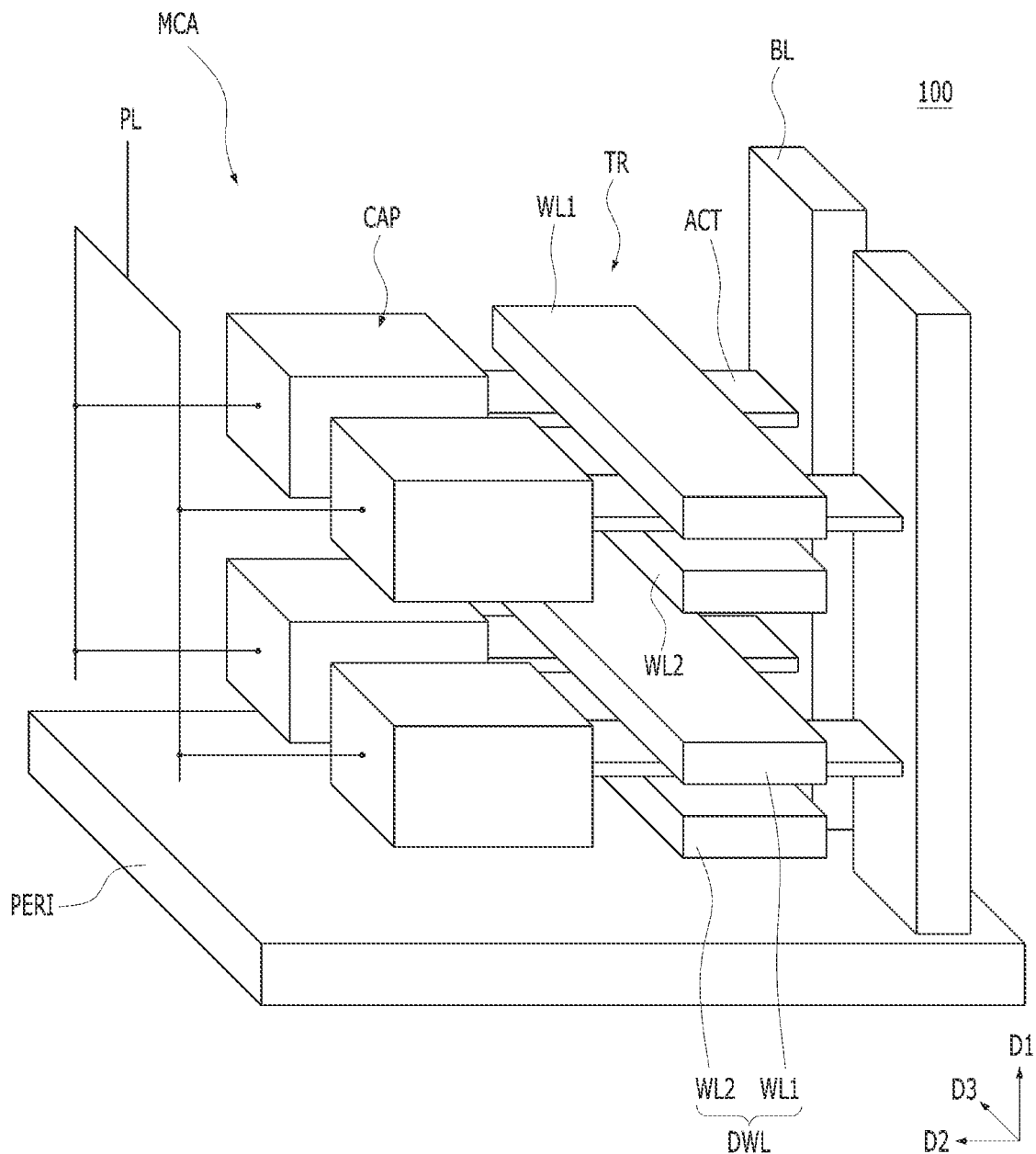
FIG. 3A is a schematic perspective view of a semiconductor memory device according to an embodiment of the present invention.
Figure 3B:
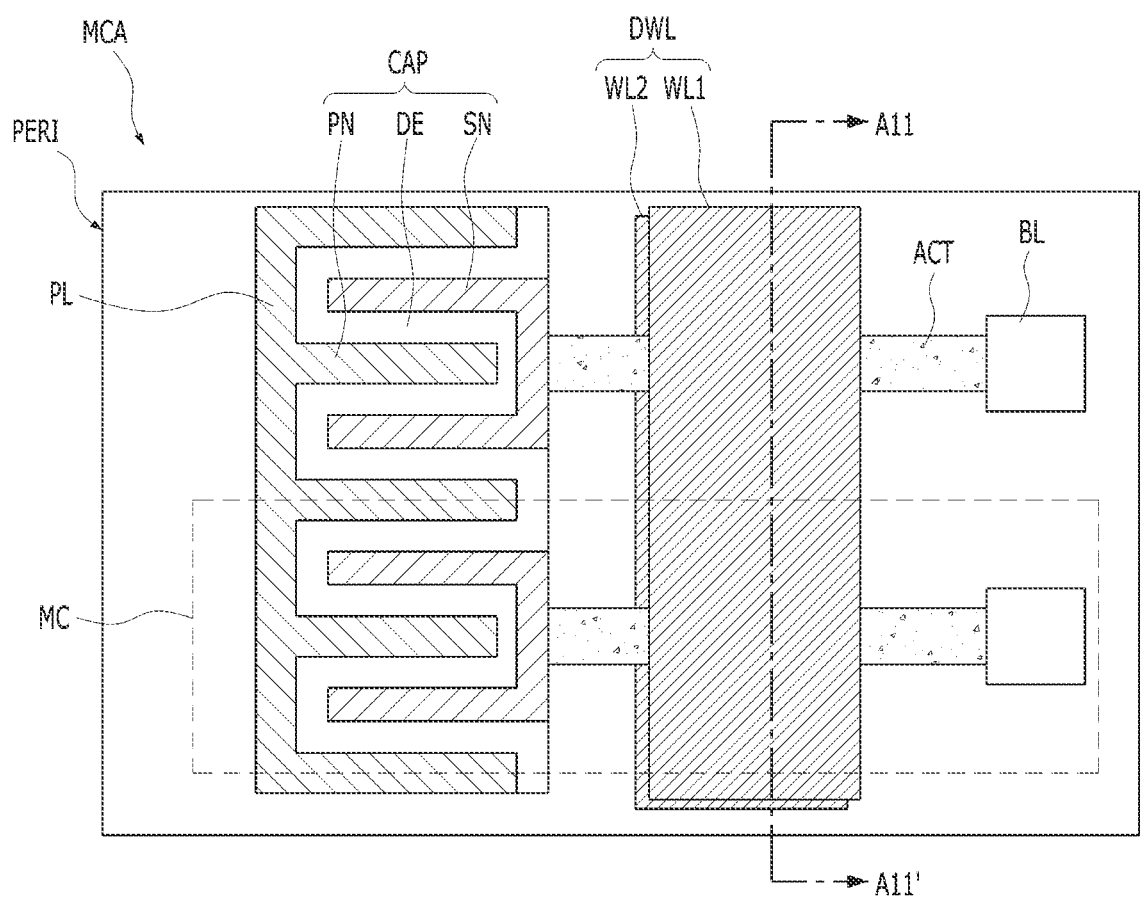
FIG. 3B is a layout view of a semiconductor memory device according to an embodiment of the present invention.

FIG. 3A is a schematic perspective view of a semiconductor memory device according to an embodiment of the present invention. FIG. 3B is a layout view of a semiconductor memory device, and FIG. 3C is a cross-sectional view taken along a line A11-A11' of FIG. 3B.

Figure 3C:
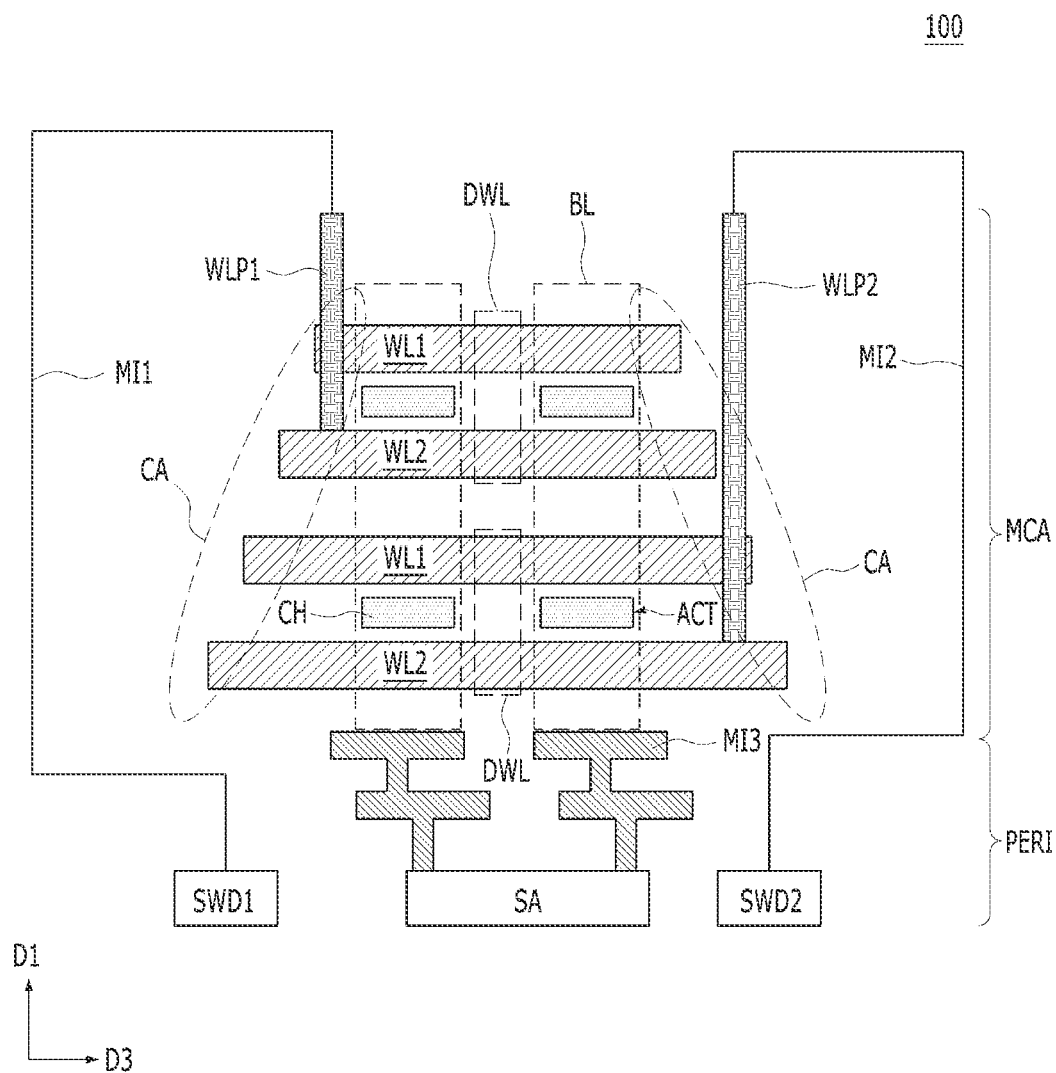
FIG. 3C is a cross-sectional view of the semiconductor memory device taken along a line A11-A11' of FIG. 3B.

Referring to FIGS. 3A to 3C, a semiconductor memory device 100 may include a memory cell array MCA. The unit memory cells MC of FIGS. 1 and 2 may be arranged in the first to third directions D1 to D3 and may configure a multi-layered memory cell array MCA. The memory cell array MCA may include a 3D array of the memory cells MC. The 3D memory cell array may include a vertical memory cell array and a lateral memory cell array. The vertical memory cell array may refer to an array of the memory cells MC vertically arranged along the first direction D1. The lateral memory cell array may refer to an array of the memory cells MC laterally arranged along the third direction D3. The vertical memory cell array may be referred to as a column array of the memory cells MC, and the lateral memory cell array may be referred to as a row array of the memory cells MC. The bit line BL may be vertically oriented to be connected to the vertical memory cell array, and the double word line DWL may be laterally oriented to be connected to the lateral memory cell array. A bit line connected to the vertical memory cell array may be referred to as a common bit line. Neighbors of the vertical memory cell arrays, which are consecutively disposed along the third direction, may be connected to different common bit lines. A double word line connected to the lateral memory cell array may be referred to as a common double word line. Neighbors of the vertical memory cell arrays, which are consecutively disposed along the first direction D1, may be connected to the different common double word lines.

The memory cell array MCA may include a plurality of memory cells MC, and each of the memory cells MC may include a vertically oriented bit line BL, a laterally oriented active layer ACT, the double word line DWL, and the laterally oriented capacitor CAP. FIG. 3A illustrates an example of a 3D memory cell array composed of four memory cells MC.

Each of the bit lines BL may be in contact with neighbors of the active layers ACT which are consecutively disposed along the first direction D1. Neighbors of the active layers ACT which are consecutively disposed along the third direction D3 may share a one double word line DWL. Each of the capacitors CAP may be connected to each of the active layers ACT. The capacitors CAP may share one plate line PL. Each of the active layers ACT may be thinner than the first and second word lines WL1 and WL2 of the double word line DWL.

In the memory cell array MCA, two double word lines DWL may be vertically stacked along the first direction D1. Each of the double word lines DWL may include a pair of the first word line WL1 and the second word line WL2. Between the first word line WL1 and the second word line WL2, a plurality of active layers ACT may be laterally arranged along the second direction D3 and spaced apart from each other. The thin-body channel CH of the active layers ACT may be disposed between the first and second word lines WL1 and WL2.

The double word lines DWL may include edge portions, each of the edge portions having a step-shape. The step-shape may define contact portions CA. Each of the first word line WL1 and the second word line WL2 may include edge portions, that is, the contact portions CA. Each of the contact portions CA may have a step-shape.

Each of the contact portions CA may be connected to first and second word line pads WLP1 and WLP2. The contact portion CA of the first word line WL1 and the second word line WL2 at an upper-level may be connected to the first word line pad WLP1. The contact portion CA of the first word line WL1 and the second word line WL2 at a lower-level may be connected to the second word line pad WLP2. The first word line WL1 and the second word line WL2 at the upper-level may be interconnected through the first word line pad WLP1. The first word line WL1 and the second word line WL2 at the lower-level may be interconnected through the second word line pad WLP2.

The semiconductor memory device 100 may further include a substrate PERI, and the substrate PERI may include a peripheral circuit. Hereafter, the substrate PERI will be abbreviated as the peripheral circuit PERI. The bit line BL of the memory cell array MCA may be vertically oriented to the surface of the peripheral circuit PERI. The double word line DWL may be laterally oriented parallel to the surface of the peripheral circuit PERI.

The peripheral circuit PERI may be positioned at a lower level than the memory cell array MCA. This may be referred to as a cell over PERI (COP) structure. The peripheral circuit may include one or more control circuits to drive the memory cell array MCA. At least one control circuit of the peripheral circuit PERI may include a N-channel transistor, a P-channel transistor, a CMOS circuit, or a combination thereof. At least one control circuit of the peripheral circuit PERI may include an address decoder circuit, a read circuit, and a write circuit. At least one control circuit of the peripheral circuit PERI may include a planar channel transistor, recess channel transistor, a buried gate transistor, and a Fin channel transistor (FinFET).

For example, the peripheral circuit PERI may include sub word line drivers SWD1 and SWD2 and a sense amplifier SA. The first and second word lines WL1 and WL2 of an upper level may be connected to the sub word line driver SWD1 through the first word line pads WLP1 and first metal interconnections MI1. The first and second word lines WL1 and WL2 lower level may be connected to the sub word line driver SWD2 through the second word line pads WLP2 and second metal interconnections MI2. The bit lines BL may be connected to the sense amplifier SA through third metal interconnections MI3. The third metal interconnections MI3 may include a multi-level metal (MLM) structure including a plurality of vias and a plurality of metal interconnections.

Figure 4:
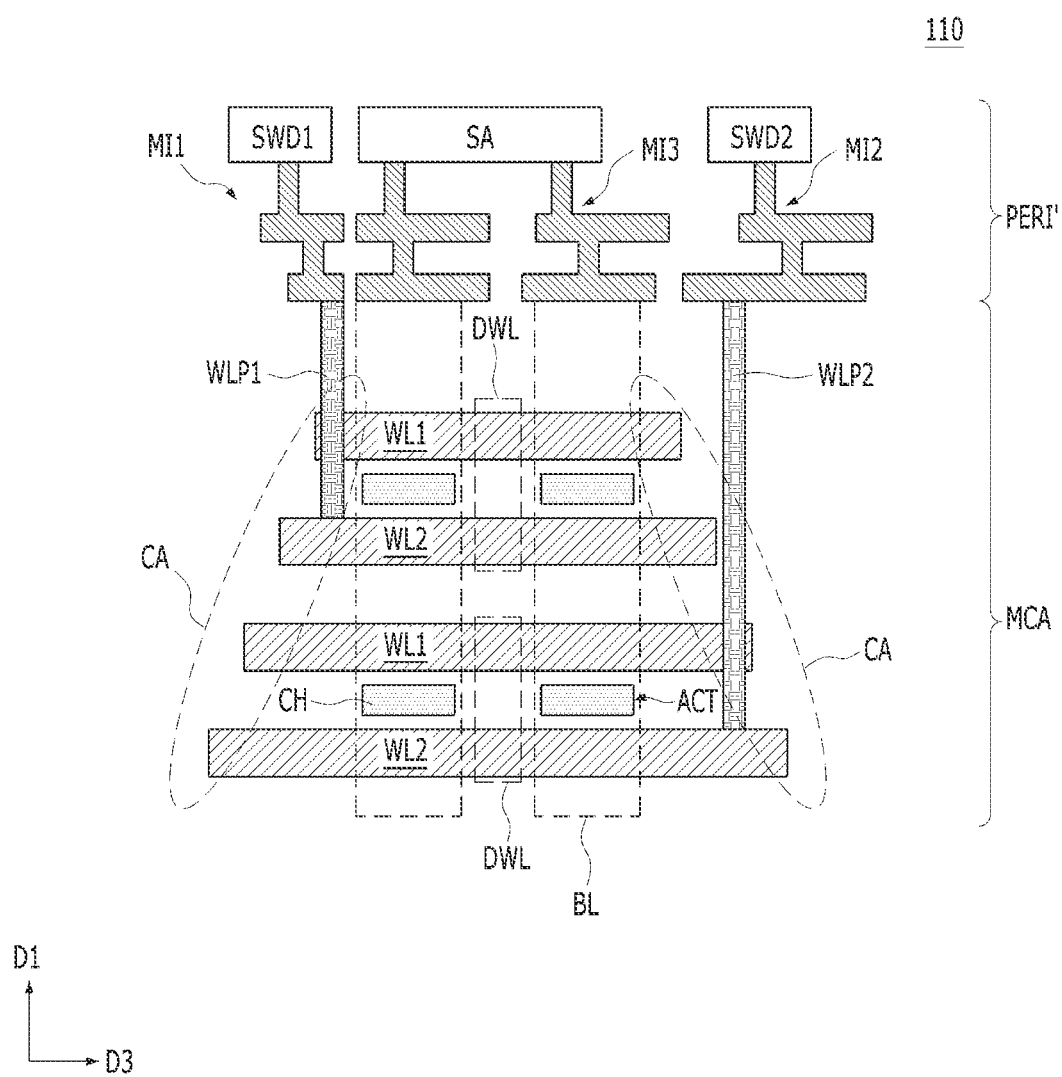
FIG. 4 is a schematic cross-sectional view of a memory cell array of a semiconductor memory device according to an embodiment of the present invention.

FIG. 4 is a schematic cross-sectional view of a memory cell array of a semiconductor memory device according to an embodiment of the present invention. FIG. 4 illustrates a semiconductor memory device 110 having a PERI over cell (POC) structure. In FIG. 4, detailed description of duplicate components illustrated in FIG. 3C may be omitted.

Referring to FIG. 4, the semiconductor memory device 110 may include the memory cell array MCA and a peripheral circuit PERI'. The peripheral circuit PERI' may be positioned at an upper level than the memory cell array MCA and over the memory cell array MCA. This may be referred to as a PERI over cell (POC) structure.

Figure 5A:
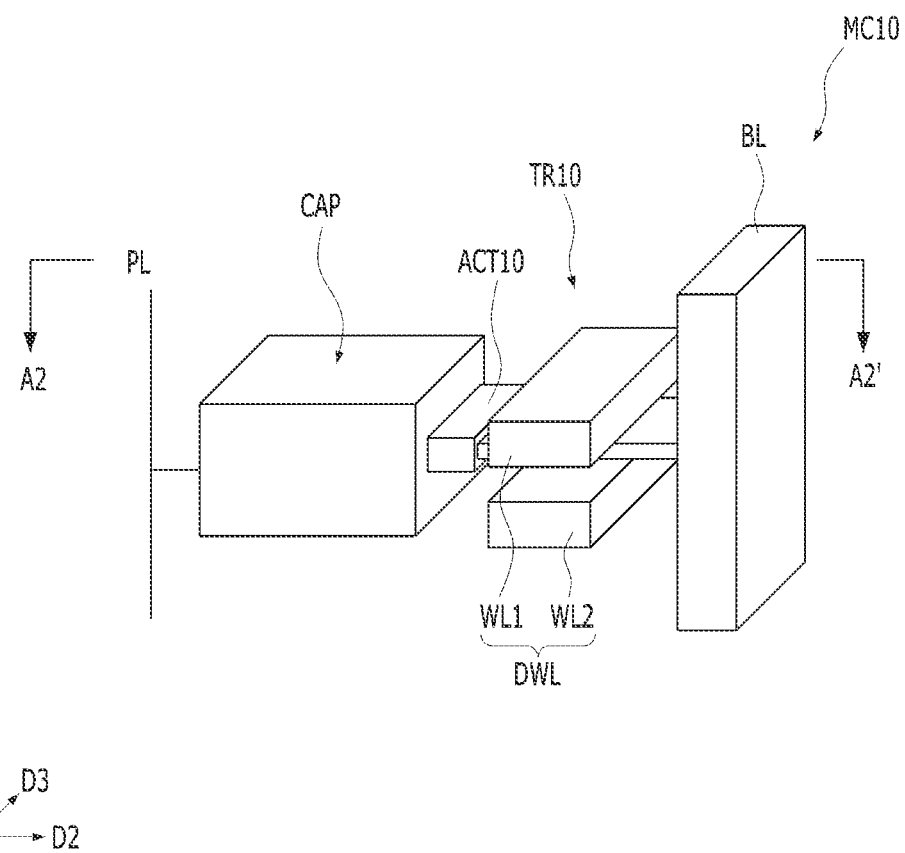
FIG. 5A is a schematic perspective view of a unit memory cell of a semiconductor memory device according to an embodiment of the present invention.
Figure 5B:
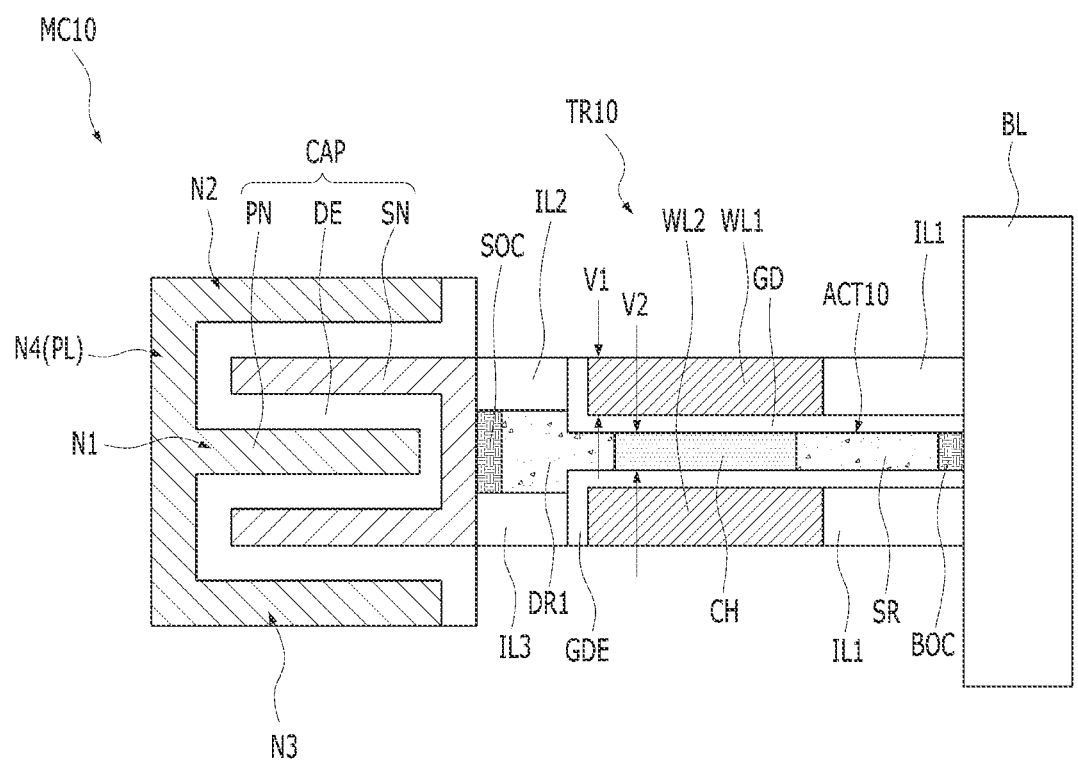
FIG. 5B is a cross-sectional view of the semiconductor memory device taken along a line A2-A2' of FIG. 5A.
Figure 5C:
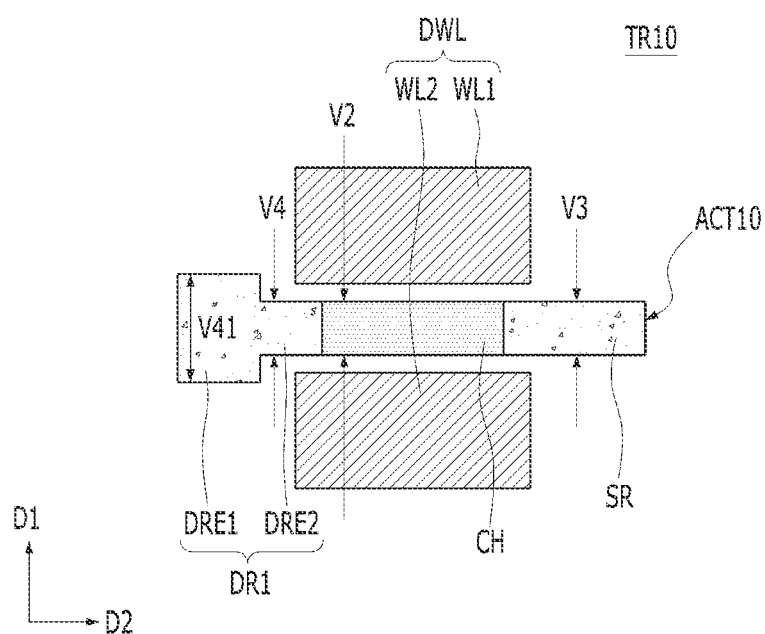
FIG. 5C is an enlarged view of a transistor.

FIG. 5A is a schematic perspective view of a unit memory cell of a semiconductor memory device according to an embodiment of the present invention. FIG. 5B is a cross-sectional view of the semiconductor memory device taken along a line A2-A2' of FIG. 5A. FIG. 5C is an enlarged view of a transistor. In FIGS. 5A to 5C, detailed description of duplicate components illustrated in FIGS. 1 to 4 may be omitted.

Referring to FIGS. 5A to 5C, a unit memory cell MC10 of a 3D semiconductor memory device may include a bit line BL, a transistor TR10, and a capacitor CAP. The transistor TR10 may include an active layer ACT10, a gate dielectric layer GD, and a double word line DWL. The capacitor CAP may include a storage node SN, a dielectric layer DE, and a plate node PN. The bit line BL may have a pillar-shape extending in the first direction D1. The active layer ACT10 may have a bar-shape extending in the second direction D2 intersecting with the first direction D1. The double word line DWL may have a line-shape extending in the third direction D3 intersecting with both the first and second directions D1 and D2. The plate node PN of the capacitor CAP may be connected to the plate line PL. The bit line BL may be vertically oriented along the first direction D1.

The transistor TR10 may include the active layer ACT10, the gate dielectric layer GD, and the double word line DWL. The double word line DWL may be extended in the third direction D3. The active layer ACT10 may be extended in the second direction D2. The active layer ACT10 may be laterally arranged from the bit line BL. The double word line DWL may include the first and second word lines WL1 and WL2. The first and second word lines WL1 and WL2 may face each other with the active layer ACT10 interposed therebetween. The gate dielectric layer GD may be formed on upper and lower surfaces of the active layer ACT10. The gate dielectric layer GD may include a gate dielectric layer extension GDE that covers the sides of the double word line DWL, for example, the sides of the double word line DWL which are adjacent to a second source/drain region DR1.

The active layer ACT10 may include a thin-body channel CH, a first source/drain region SR between the thin-body channel CH and the bit line BL, and a second source/drain region DR1 between the thin-body channel CH and the capacitor CAP. A first side of the first source/drain region SR may be connected to the bit line BL. A second side of the first source/drain region SR may be connected to the thin-body channel CH. A first side of the second source/drain region DR1 may be connected to the storage node SN. A second side of the second source/drain region DR1 may be connected to the thin-body channel CH. Each of the second sides of the first and the second source/drain regions SR and DR1 may partially overlap with sides of the first and second word lines WL1 and WL2. A bit line side-ohmic contact BOC may be formed between the first source/drain region SR and the bit line BL. The bit line side-ohmic contact BOC may be formed by a reaction between a metal of the bit line BL and the silicon of the first source/drain region SR. The bit line side-ohmic contact BOC may include metal silicide and may be formed on an edge of the active layer ACT10, which is the first side of the first source/drain region SR. A storage node side-ohmic contact SOC may be formed between the second source/drain region DR1 and the storage node SN. The storage node side-ohmic contact SOC may include metal silicide and may be formed on another edge of the active layer ACT10, which is the first side of the second source/drain region DR1. The storage node side-ohmic contact SOC may be formed by a reaction between a metal of the storage node SN and the silicon of the second source/drain region DR1.

Referring to FIG. 5C again, the second source/drain region DR1 may include a first side region DRE1 and a second side region DRE2. A thickness V41 of the first side region DRE1 of the second source/drain region DR1 may be larger than a thickness V4 of the second side region DRE2. The thickness V41 of the first side region DRE1 of the second source/drain region DR1 may be larger than a thickness V2 of the thin-body channel CH. A thickness V3 of the first source/drain region SR may be smaller than the thickness V41 of the first side region DRE1 of the second source/drain region DR1. The thickness V3 of the first source/drain region SR may be the same as the thickness V2 of the thin-body channel CH and a thickness V4 of the second side region DRE2 of the second source/drain region DR1.

As described above, the active layer ACT10 may have a partially thin structure including a thick portion and a thin portion. The thickness V3 of the first source/drain region SR, the thickness V2 of the thin-body channel CH, and the thickness V4 of the second side region DRE2 of the second source/drain region DR1 may be smaller than each of thicknesses of the first and second word lines WL1 and WL2 of the double word line DWL. The thickness V41 of the first side region DRE1 of the second source/drain region DR1 may be equal to or thinner than each of the thicknesses of the first and second word lines WL1 and WL2 of the double word line DWL.

A plurality of unit memory cells MC10 as the one shown in FIG. 5A may be arranged in the first to third directions D1 to D3 and may configure a multi-layered memory cell array MCA. The memory cell array MCA may include the plurality of the memory cells MC10. Each of the memory cells MC10 may include a vertically oriented bit line BL, a laterally oriented active layer ACT10, a double word line DWL, and a laterally oriented capacitor CAP. The memory cell array MCA of the memory cells MC10 may be similar to the memory cell array MCA shown in FIG. 3A. A semiconductor memory device including a memory cell array MCA of a plurality of unit memory cells MC10 may further include a peripheral circuit PERI and may be arranged in the COP structure shown in FIG. 3C or the POC structure shown in FIG. 4.

Figure 5D:
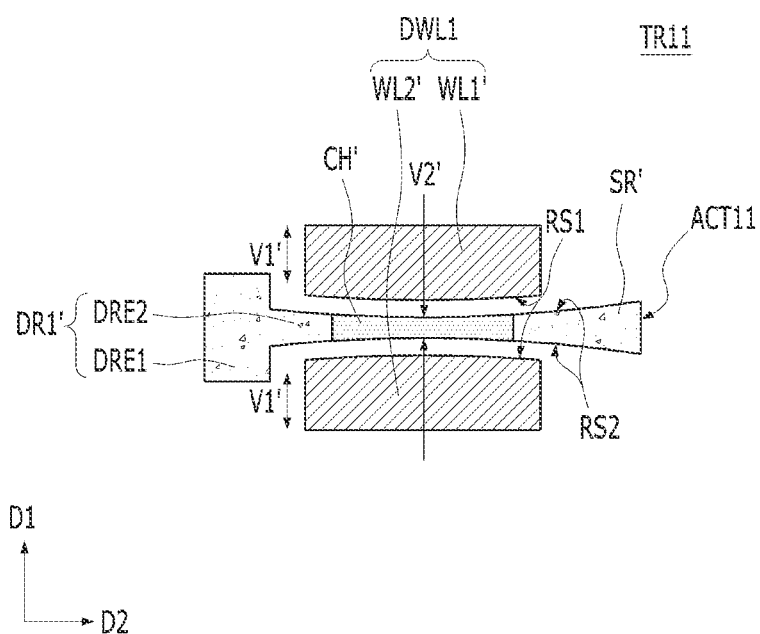
FIG. 5D is a modified example of a transistor TR10 of FIG. 5C.

FIG. 5D illustrates a modified example of the transistor TR10 of FIG. 5C.

Referring to FIG. 5D, a transistor TR11 may include an active layer ACT11 and a double word line DWL1. The double word line DWL1 may include the first and second word lines WL1' and WL2' facing each other with the active layer ACT11 interposed therebetween. The active layer ACT11 may include a thin-body channel CH', a first source/drain region SR' on one side of the thin-body channel CH', and a second source/drain region DR1' on another side of the thin-body channel CH'.

Each of the first and second word lines WL1' and WL2' of the double word line DWL1 may include a first round surface RS1, and the active layer ACT11 may include second round surfaces RS2. The first and second round surfaces RS1 and RS2 may face each other. A gate dielectric layer may be formed between the double word line DWL1 and the active layer ACT11. The second round surfaces RS2 may be formed on surfaces of a second side region DRE2 of the second source/drain region DR1'. The surface of the first side region DRE1 of the second source/drain region DR1' may have a flat-shape.

Comparing thicknesses measured in a direction parallel to the first direction D1, an edge thickness V1' of the first and second word lines WL1' and WL2' may be larger than a central thickness V2' of the thin-body channel CH'. An average thickness of the thin-body channel CH' may be smaller than an average thickness of the first word line WL1' and an average thickness of the second word line WL2'. The average thickness of the thin-body channel CH' may be equal to or less than 7 nm. An average thickness of the first source/drain region SR' and an average thickness of the second source/drain region DR1' may be larger than the average thickness of the thin-body channel CH', but thinner than the average thickness of the first word line WL1' and the average thickness of the second word line WL2'. Here, the average thickness of a feature may refer to an average value between the thickest portion and the thinnest portion of the feature.

Figure 6A:
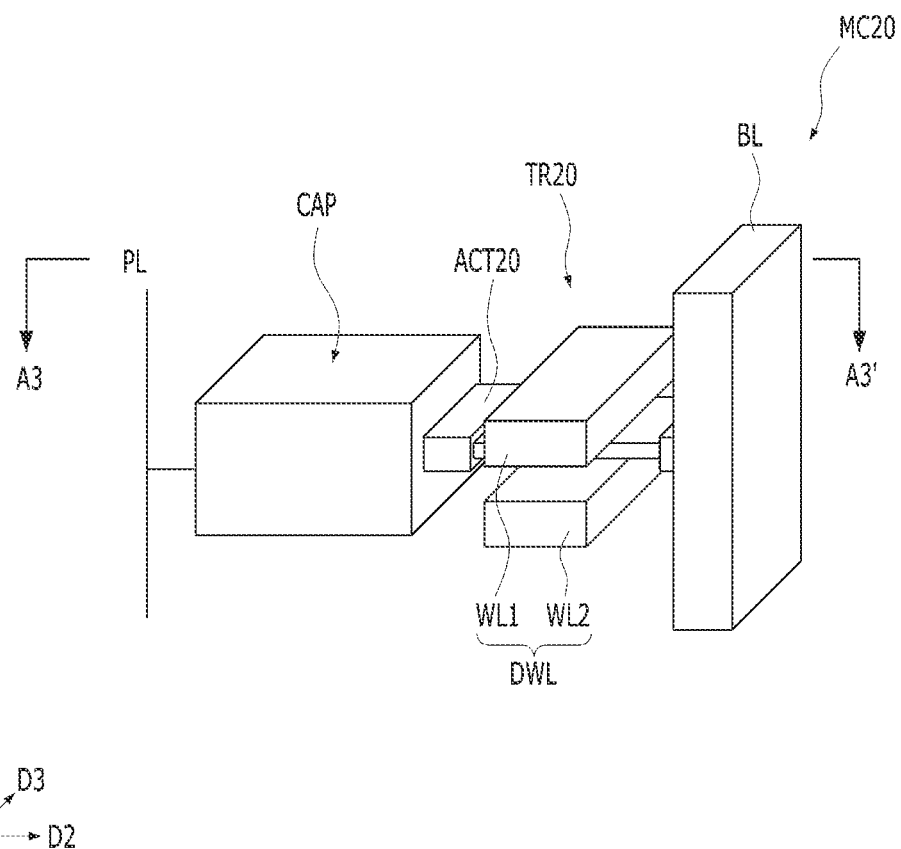
FIG. 6A is a schematic perspective view of a unit memory cell of a semiconductor memory device according to an embodiment of the present invention.
Figure 6B:
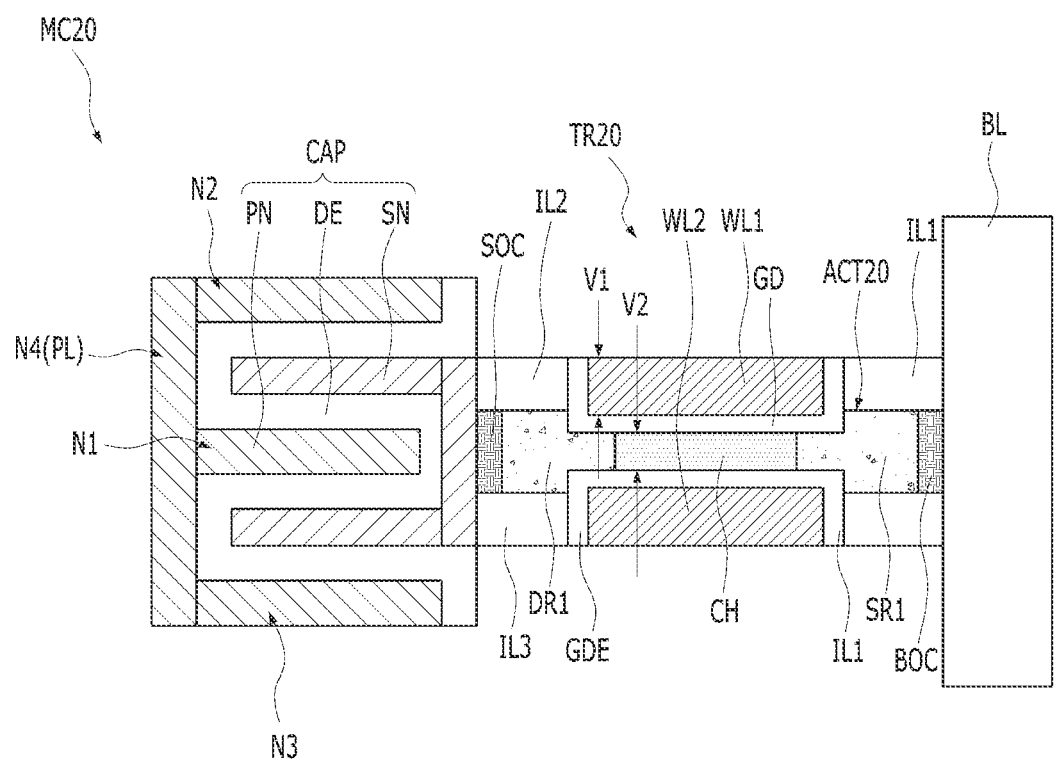
FIG. 6B is a cross-sectional view of the semiconductor memory device taken along a line A3-A3' of FIG. 6A.
Figure 6B:
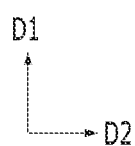
Figure 6C:
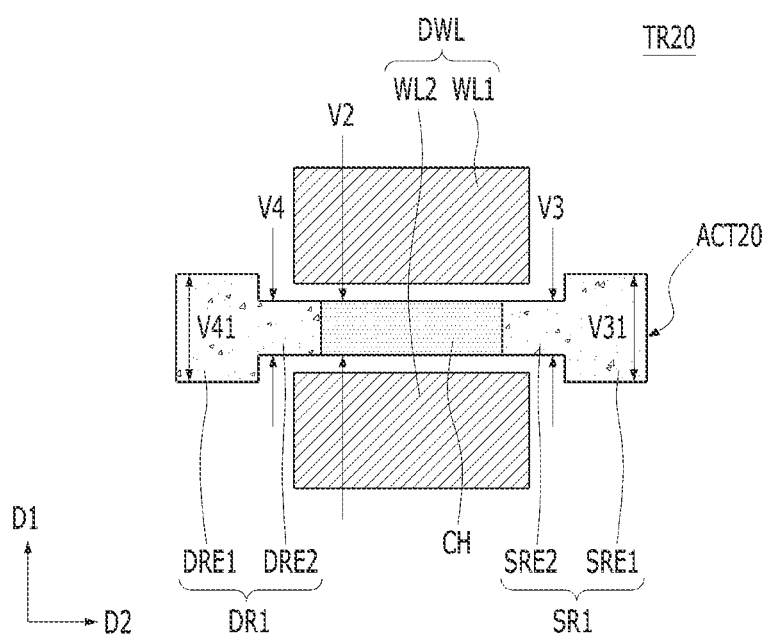
FIG. 6C is an enlarged view of a transistor.

FIG. 6A is a schematic perspective view of a unit memory cell of a semiconductor memory device according to an embodiment of the present invention. FIG. 6B is a cross-sectional view of the semiconductor memory device taken along a line A3-A3'. FIG. 6C is an enlarged view of a transistor. In FIGS. 6A to 6C, detailed description of duplicate components illustrated in FIGS. 1 to 5C may be omitted.

Referring to FIGS. 6A to 6C, a unit memory cell MC20 of a 3D semiconductor memory device may include a bit line BL, a transistor TR, and a capacitor CAP. The transistor TR may include an active layer ACT20, a gate dielectric layer GD, and a double word line DWL. The capacitor CAP may include a storage node SN, a dielectric layer DE, and a plate node PN. The bit line BL may have a pillar-shape extending in the first direction D1. The active layer ACT20 may have a bar-shape extending in the second direction D2 intersecting with the first direction D1. The double word line DWL may have a line-shape extending in the third direction D3 intersecting with both the first and second directions D1 and D2. The plate node PN of the capacitor CAP may be connected to the plate line PL. The bit line BL may be vertically oriented along the first direction D1.

The transistor TR may include the active layer ACT20, the gate dielectric layer GD, and the double word line DWL. The double word line DWL may be extended in the third direction D3. The active layer ACT20 may be extended in the second direction D2. The active layer ACT20 may be laterally arranged from the bit line BL. The double word line DWL may include the first and second word lines WL1 and WL2. The first and second word lines WL1 and WL2 may face each other with the active layer ACT20 interposed therebetween. The gate dielectric layer GD may be formed on upper and lower surfaces of the active layer ACT20. The gate dielectric layer GD may include a gate dielectric layer extension GDE that covers both sides of the double word line DWL, for example, the sides adjacent to the first source/drain region SR1 and the second source/drain region DR1.

The active layer ACT20 may include a thin-body channel CH, a first source/drain region SR1 disposed between the thin-body channel CH and the bit line BL, the second source/drain region DR1 disposed between the thin-body channel CH and the capacitor CAP. A first side of the first source/drain region SR1 may be in contact with the bit line BL. A second side of the first source/drain region SR1 may be in contact the thin-body channel CH. A first side of the second source/drain region DR1 may be in contact with the storage node SN. A second side of the second source/drain region DR1 may be in contact with the thin-body channel CH. Each of the second sides of the first source/drain region SR1 and the second source/drain region DR1 may partially overlap with sides of the first and second word lines WL1 and WL2. A bit line side-ohmic contact BOC may be formed between the first source/drain region SR1 and the bit line BL. The bit line side-ohmic contact BOC may be formed by a reaction between a metal of the bit line BL and the silicon of the first source/drain region SR1. The bit line side-ohmic contact BOC may include metal silicide and be formed on an edge of the active layer ACT20, which is the first side of the first source/drain region SR1. A storage node side-ohmic contact SOC may be formed between the second source/drain region DR1 and the storage node SN. The storage node side-ohmic contact SOC may include metal silicide and be formed on another edge of the active layer ACT20, which is the first side of the second source/drain region DR1. The storage node side-ohmic contact SOC may be formed by a reaction between a metal of the storage node SN and the silicon of the second source/drain region DR1.

Referring to FIG. 6C again, the second source/drain region DR1 may include the first side region DRE1 and the second side region DRE2. A thickness V41 of the first side region DRE1 of the second source/drain region DR1 may be larger than a thickness V4 of the second side region DRE2. The thickness V41 of the first side region DRE1 of the second source/drain region DR1 may be larger than the thickness V2 of the thin-body channel CH.

The first source/drain region SR1 may include a first side region SRE1 and a second side region SRE2. A thickness V31 of the first side region SRE1 of the first source/drain region SR1 may be larger than a thickness V3 of the second side region SRE2. The thickness V31 of the first side region SRE1 of the first source/drain region SR1 may be larger than the thickness V2 of the thin-body channel CH.

The thickness V3 of the second side region SRE2 of the first source/drain region SR1 may be smaller than the thickness V31 of the first side region SRE1 of the first source/drain region SR1. The thickness V3 of the second side region SRE2 of the first source/drain region SR1 may be the same as the thickness V2 of the thin-body channel CH and the thickness V4 of the second side region DRE2 of the second source/drain region DR1.

The thickness V31 of the first side region SRE1 of the first source/drain region SR1 and the thickness V41 of the first side region DRE1 of the second source/drain region DR1 may be the same. The thickness V31 of the first side region SRE1 of the first source/drain region SR1 and the thickness V41 of the first side region DRE1 of the second source/drain region DR1 may be larger than the thickness V2 of the thin-body channel CH.

As described above, the active layer ACT20 may have a partially thin structure including a thick portion and a thin portion. The thickness V3 of the second side region SRE2 of the first source/drain region SR1, the thickness V2 of the thin-body channel CH, and the thickness V4 of the second side region DRE2 of the second source/drain region DR1 may be smaller than the first and second word lines WL1 and WL2 of the double word line DWL. The thickness V41 of the first side region DRE1 of the second source/drain region DR1 and the thickness V31 of the first side region SRE1 of the first source/drain region SR1 may be equal to or thinner than the first and second word lines WL1 and WL2 of the double word line DWL.

The unit memory cell MC20 shown in FIG. 6A may be arranged in the first to third directions D1 to D3 and configure a multi-layered memory cell array MCA. The memory cell array MCA may include a plurality of the memory cells MC20. Each of memory cells may include a vertically oriented bit line BL, a laterally oriented active layer ACT20, a double word line DWL, and a laterally oriented capacitor CAP. The memory cell array MCA of the unit memory cell MC20 may be similar to the memory cell array MCA shown in FIG. 3A. A semiconductor memory device including the memory cell array MCA of the unit memory cell MC20 may further include the peripheral circuit PERI and may be arranged in the COP structure shown in FIG. 3C or the POC structure shown in FIG. 4.

Figure 6D:
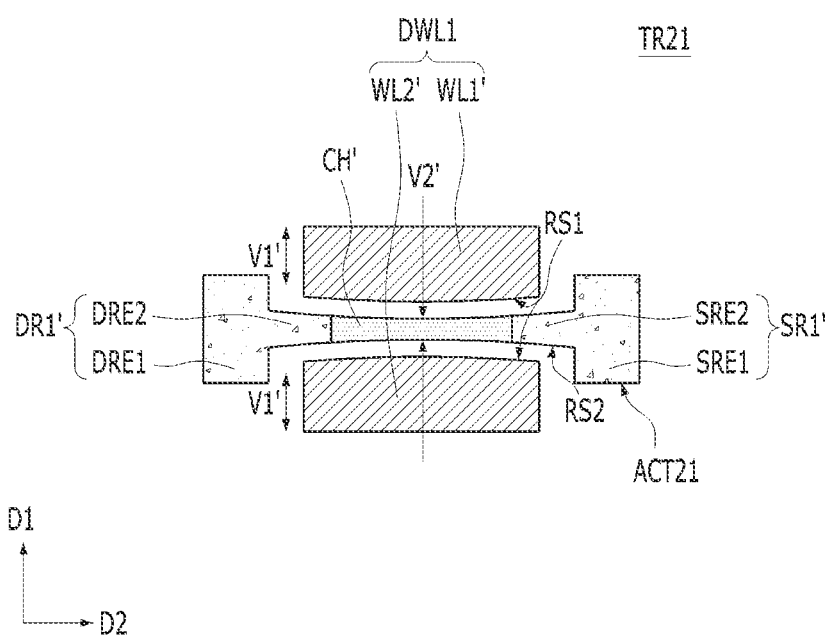
FIG. 6D is a modified example of a transistor TR20 of FIG. 6C.

FIG. 6D illustrates a modified example of the transistor TR20 shown in FIG. 6C.

Referring to FIG. 6D, a transistor TR21 may include an active layer ACT21 and the double word line DWL1. A double word line DWL1 may include the first and second word lines WL1' and WL2' facing each other with the active layer ACT21 interposed therebetween. The active layer ACT21 may include a thin-body channel CH', a first source/drain region SR1' on one side of the thin-body channel CH', and a second source/drain region DR1' on another side of the thin-body channel CH'.

Each of the first and second word lines WL1' and WL2' of the double word line DWL1 may include a first round surface RS1. The active layer ACT21 may include second round surfaces RS2. The first round surfaces RS1 and the second round surfaces RS2 may face each other. A gate dielectric layer may be formed between the double word line DWL1 and the active layer ACT21. The second round surfaces RS2 may be formed on the second side region SRE2 of the first source/drain region SR1' and the second side region DRE2 of the second source/drain region DR1'. The surfaces of the first side region SRE1 of the first source/drain region SR1' and the first side region DRE1 of the second source/drain region DR1' may include a flat-shape.

Comparing thicknesses measured in a direction parallel to the first direction D1, an edge thickness V1' of the first and second word lines WL1' and WL2' may be larger than a center thickness V2' of the thin-body channel CH'. An average thickness of the thin-body channel CH' may be smaller than each of average thicknesses of the first and second word lines WL1' and WL2'. The average thickness of the thin-body channel CH' may be equal to or shorter than 7 nm. Each of average thicknesses of the first source/drain region SR1' and the second source/drain region DR1' may be larger than the average thickness of the thin-body channel CH', but thinner than each of the average thicknesses of the first and second word lines WL1' and WL2'. Here, the average thickness of a feature may refer to an average value between the thickest portion and the thinnest portion of the feature.

Figure 7A:
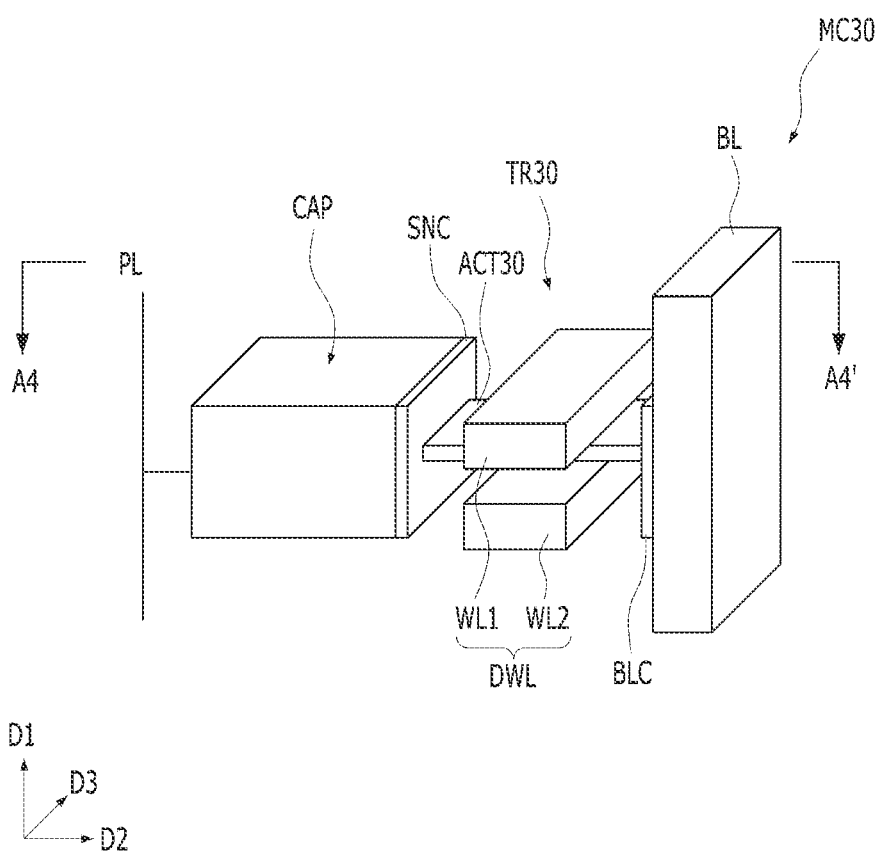
FIG. 7A is a schematic perspective view of a unit memory cell of a semiconductor memory device according to an embodiment of the present invention.
Figure 7B:
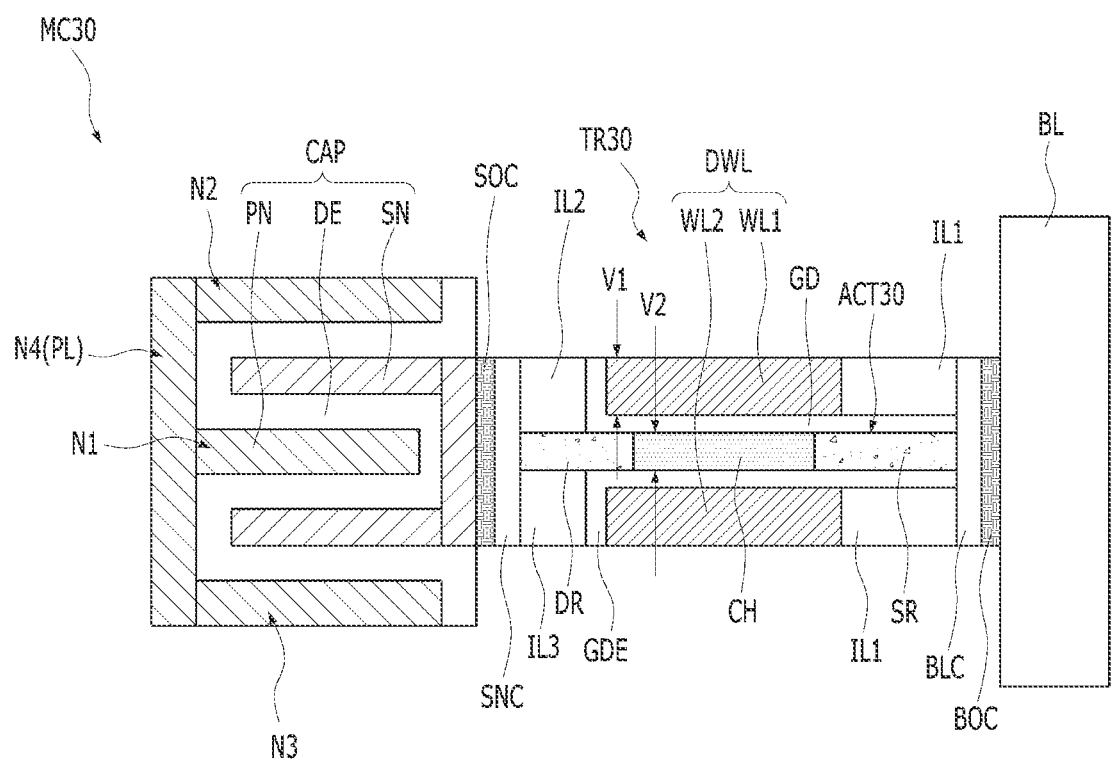
FIG. 7B is a cross-sectional view taken along a line A4-A4' of FIG. 7A.

FIG. 7A is a schematic perspective view of a unit memory cell of a semiconductor memory device in accordance with an embodiment of the present invention. FIG. 7B is a cross-sectional view taken along a line A4-A4' of FIG. 4A. The unit memory cell shown in FIGS. 7A and 7B may be similar to the unit memory cell shown in FIGS. 1 to 2B.

Referring to FIGS. 7A and 7B, a unit memory cell MC30 of a 3D semiconductor memory device may include a bit line BL, a transistor TR, a capacitor CAP. The transistor TR may include an active layer ACT30, a gate dielectric layer GD, and a double word line DWL. The capacitor CAP may include a storage node SN, a dielectric layer DE, and a plate node PN. The bit line BL may have a pillar-shape extending in the first direction D1. The active layer ACT30 may have a bar-shape extending in the second direction D2 intersecting with the first direction D1. The double word line DWL may have a line-shape extending in the third direction D2 intersecting with the first and second directions D2 and D3. The plate node PN of the capacitor CAP may be connected to the plate line PL. The bit line BL may be vertically oriented along the first direction D1.

The double word line DWL may extend in the third direction D3, the active layer ACT30 may extend in the second direction D2. The active layer ACT may be laterally oriented from the bit line BL. The double word line DWL may include the first and second word lines WL1 and WL2. The first and second word lines WL1 and WL2 may face each other with the active layer ACT30 interposed therebetween. The gate dielectric layer GD may be formed on upper and lower surfaces of the active layer ACT30. The gate dielectric layer GD may include the gate dielectric layer extension GDE that covers the sides of the double word line DWL, for example, the sides adjacent to the second source/drain region DR.

The active layer ACT30 may include a thin-body channel CH, the first source/drain region SR disposed between the thin-body channel CH and the bit line BL, and the second source/drain region DR disposed between the thin-body channel CH and the capacitor CAP. A first side of the first source/drain region SR may contact the bit line BL. A second side of the first source/drain region SR may contact the thin-body channel CH. A first side of the second source/drain region DR may contact the storage node SN. A second side of the second source/drain region DR may contact the thin-body channel CH. Each of the second sides of the first source/drain region SR and the second source/drain region DR may partially overlap with sides of the first and second word lines WL1 and WL2. A bit line side-ohmic contact BOC and a bit line contact node BLC may be formed between the first source/drain region SR and the bit line BL. The bit line side-ohmic contact BOC may be in direct contact with the bit line BL, and the bit line contact node BLC may be in direct contact with the first source/drain region SR. A storage node side-ohmic contact SOC and a storage node contact node SNC may be formed between the second source/drain region DR and the storage node SN. The storage node side-ohmic contact SOC may be in direct contact with the storage node SN, and the storage node contact node SNC may be in direct contact with the second source/drain region DR. Each of the bit line contact node BLC and the storage node contact node SNC may include polysilicon.

The bit line side-ohmic contact BOC may be formed by a reaction between a metal of the bit line BL and the silicon of the bit line contact node BLC. The bit line side-ohmic contact BOC may include metal silicide. The storage node side-ohmic contact SOC may be formed by a reaction between a metal of the storage node SN and the silicon of the storage node contact node SNC. The storage node side-ohmic contact SOC may include metal silicide.

Each of heights of the bit line contact node BLC and the storage node contact node SNC may be bigger than a thickness V2 of the active layer ACT30. The thickness V2 of the active layer ACT30 may be smaller than each of thicknesses V1 of the first and second word lines WL1 and WL2 of the double word line DWL.

The unit memory cell MC30 of FIG. 7A may be arranged in the first to third directions D1 to D3 and may configure a multi-layered memory cell array MCA. The memory cell array MCA may include a plurality of unit memory cells MC30. Each of the unit memory cells MC30 may include a vertically oriented bit line BL, a laterally oriented active layer ACT, a double word line DWL, and a laterally oriented capacitor CAP. The memory cell array MCA of the unit memory cells MC30 may be similar to the memory cell array MCA shown in FIG. 3A. A semiconductor memory device including the memory cell array MCA of the unit memory cells MC30 may further include a peripheral circuit PERI and may be arranged in the COP structure shown in FIG. 3C or the POC structure shown in FIG. 4.

In an embodiment, the active layer ACT30 of the unit memory cell MC30 shown in FIG. 7A may be modified to have the same shape of the active layer ACT10 shown in FIG. 5A and the active layer ACT20 shown in FIG. 6A.

In the embodiments according to FIGS. 1 to 7B, a thickness of the thin-body channel CH may be smaller than each of thicknesses of the first and second word lines WL1 and WL2 of the double word line DWL. The active layers ACT, ACT10, and ACT20, which include the thin-body channel CH thinner than the first and second word lines WL1 and WL2, may be referred to as a thin body. A thin thin-body channel may be referred to as a thin channel. The memory cells MC, MC10, MC20, and MC30, which are stacked along the first direction D1, may have an improved integration degree due to the thin thin-body channel CH.

Figure 8A:
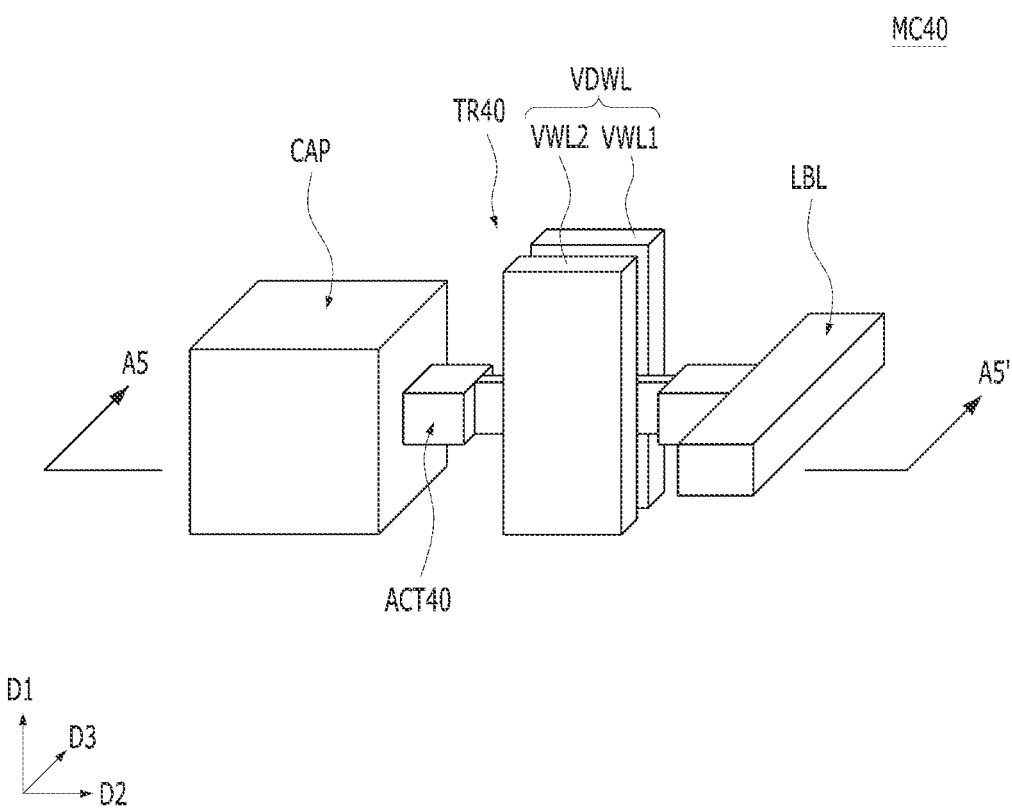
FIG. 8A is a schematic perspective view of a unit memory cell of a semiconductor memory device according to an embodiment of the present invention.
Figure 8B:
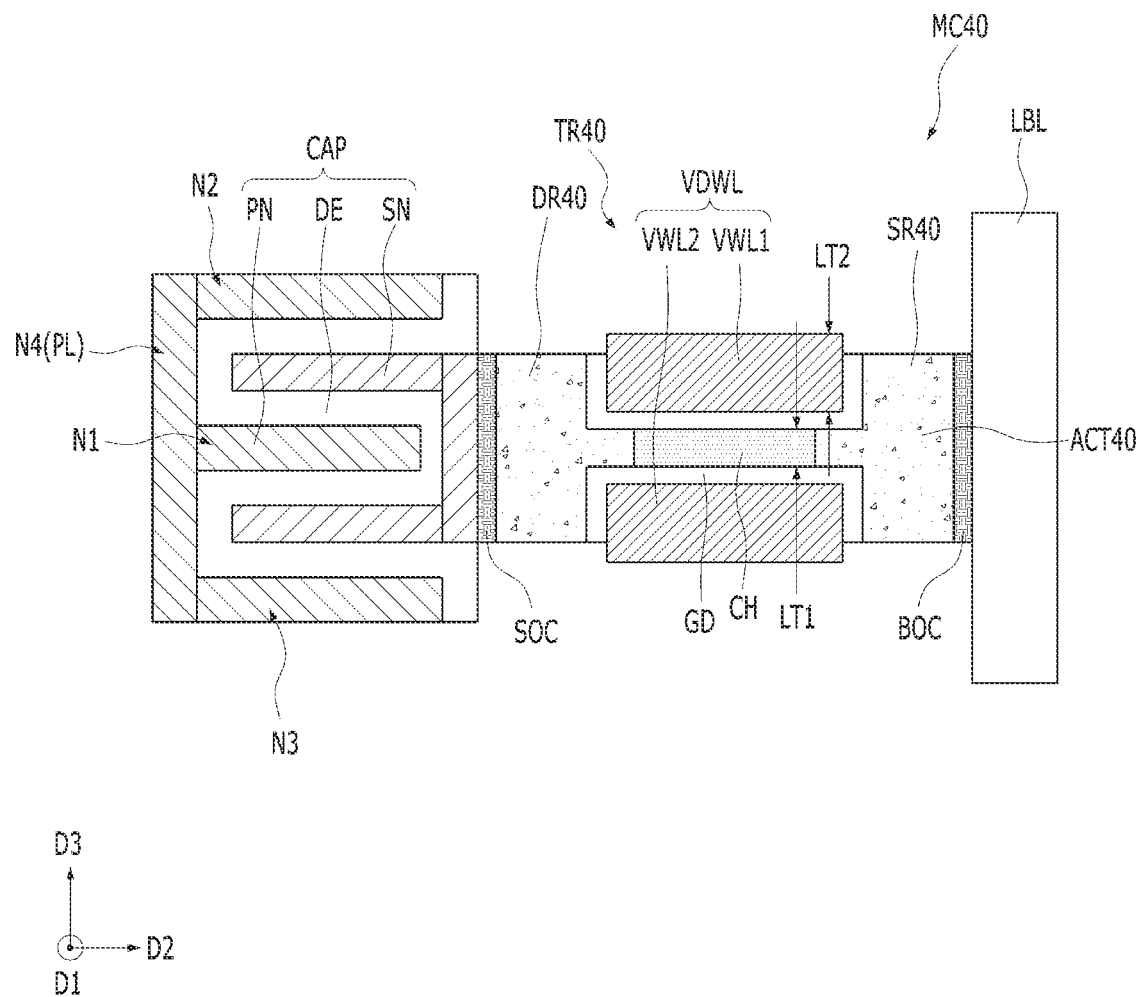
FIG. 8B is a cross-sectional view of the semiconductor memory device taken along a line A5-A5' of FIG. 8A.
Figure 8C:
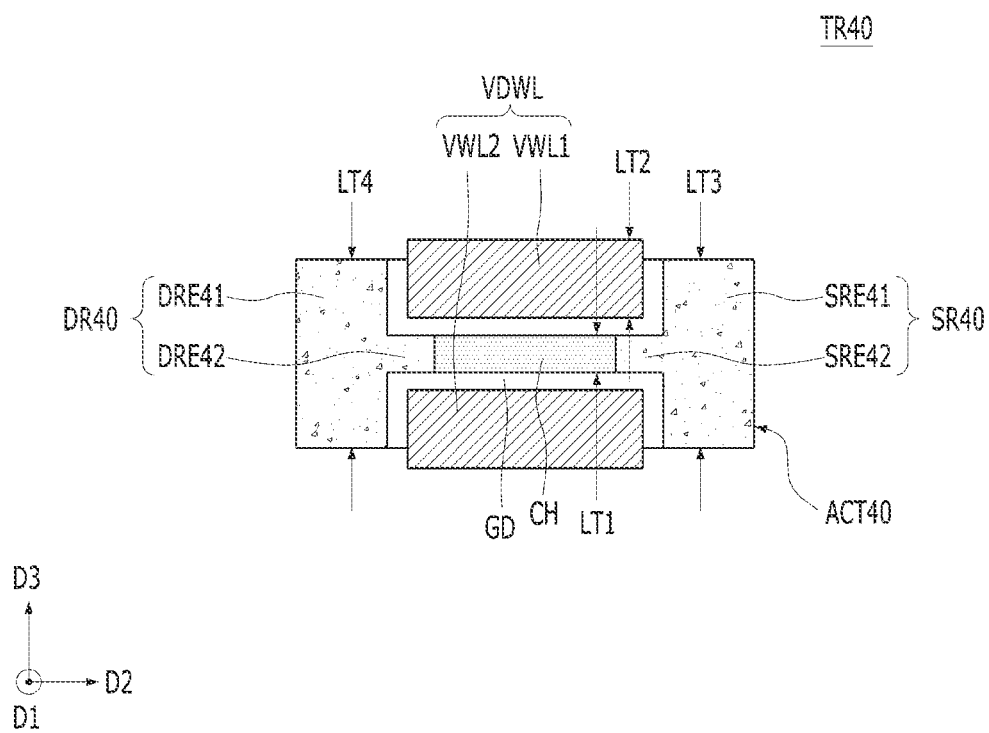
FIG. 8C is an enlarged view of a transistor.

FIG. 8A is a schematic perspective view of a unit memory cell of a semiconductor memory device in accordance with an embodiment of the present invention. FIG. 8B is a cross-sectional view of the semiconductor memory device taken along a line A5-A5' of FIG. 8A. FIG. 8C is an enlarged view of a transistor. In FIGS. 8A to 8C, detailed description of duplicate components illustrated in FIGS. 1 to 7D may be omitted.

Referring to FIGS. 8A to 8C, a unit memory cell MC40 of a 3D semiconductor memory device may include a bit line LBL, a transistor TR40, and a capacitor CAP. The transistor TR40 may include an active layer ACT40, a gate dielectric layer GD, and a double word line VDWL. The capacitor CAP may include a storage node SN, a dielectric layer DE, and a plate node PN. The double word line VDWL may vertically extend along the first direction D1. The active layer ACT40 may have a bar-shape extending in the second direction D2 intersecting with the first direction D1. The bit line LBL may have a line-shape extending in the third direction D3 intersecting with the first and second directions D2 and D3. The plate node PN of the capacitor CAP may be connected to the plate line PL.

The double word line VDWL may be vertically oriented along the first direction D1, the active layer ACT40 may be laterally oriented along the second direction D2, and the bit line LBL may be laterally oriented along the third direction D3.

The transistor TR40 may include the active layer ACT40, the gate dielectric layer GD, and the double word line VDWL. The double word line VDWL may extend in the first direction D1, the active layer ACT40 may extend in the second direction D2. The active layer ACT40 may be laterally arranged from the bit line LBL. The double word line VDWL may include the first and second word lines VWL1 and VWL2. The first and second word lines VWL1 and VWL2 may face each other with the active layer ACT40 interposed therebetween. The gate dielectric layer GD may be formed on the sides of the active layer ACT40. Here, the sides of the active layer 40 on which the gate dielectric layer GD may be formed are the ones which are parallel with the first direction D1.

The active layer ACT40 may include a thin-body channel CH, a first source/drain region SR40 between the thin-body channel CH and the bit line LBL, and a second source/drain region DR40 between the thin-body channel CH and the capacitor CAP. A first side of the first source/drain region SR40 may be in contact with the bit line LBL. A second side of the first source/drain region SR40 may be in contact with the thin-body channel CH. A first side of the second source/drain region DR40 may be in contact with the storage node SN. A second side of the second source/drain region DR40 may be in contact with the thin-body channel CH. Each of the second sides of the first and second source/drain regions SR40 and DR40 may partially overlap with sides of the first and second word lines VWL1 and VWL2. A bit line side-ohmic contact BOC may be formed between the first source/drain region SR40 and the bit line LBL. The bit line side-ohmic contact BOC may be formed by a reaction between a metal of the bit line BL and the silicon of the first source/drain region SR40. The bit line side-ohmic contact BOC may include metal silicide and may be formed on an edge of the active layer ACT40, which is the first side of the first source/drain region SR40. A storage node side-ohmic contact SOC may be formed between the second source/drain region DR40 and the storage node SN. The storage node side-ohmic contact SOC may include metal silicide and may be formed on another edge of the active layer ACT40, which is the first side of the second source/drain region DR40. The storage node side-ohmic contact SOC may be formed by a reaction between a metal of the storage node SN and the silicon of the second source/drain region DR40.

A lateral thickness LT1 of the thin-body channel Ch may be smaller than a lateral thickness LT2 of the first and second word lines VWL1 and VWL2 of the double word line VDWL. Here, the lateral thicknesses LT1 and LT2 may be parallel to the third direction D3, meaning that they may be measured in a direction parallel to the third direction D3.

Referring to FIG. 8C again, the first source/drain region SR40 may include a first side region SRE41 and a second side region SRE42. A lateral thickness LT3 of the first side region SRE41 of the first source/drain region SR40 may be larger than the lateral thickness LT1 of the second side region SRE42. The second source/drain region DR40 may include a first side region DRE41 and a second side region DRE42. A lateral thickness LT4 of the first side region DRE41 of the second source/drain region DR40 may be larger than the lateral thickness LT1 of the second side region DRE42. The lateral thickness LT3 of the first side region SRE 41 of the first source/drain region SR40 may be larger than the lateral thickness LT1 of the thin-body channel CH. The lateral thickness LT4 of the first side region DRE41 of the second source/drain region DR40 may be larger than the lateral thickness LT1 of the thin-body channel CH. The lateral thicknesses of the second side region SRE42 of the first source/drain region SR40 and the second side region DRE 42 of the second source/drain region DR40 may be equal to the lateral thickness LT1 of the thin-body channel CH. The lateral thickness LT1 of the thin-body channel CH may be smaller than the lateral thickness LT2 of each of the first and second word lines VWL1 and VWL2 of the double word line VDWL.

As described above, the active layer ACT40 may have a partially thin structure including a thick portion and a thin portion. The thin portion of the active layer ACT40 may at least include the thin-body channel CH. The lateral thickness LT1 of the thin-body channel CH may be smaller than the lateral thickness LT2 of each of the first and second word lines VWL1 and VWL2 of the double word line VDWL.

Figure 8D:
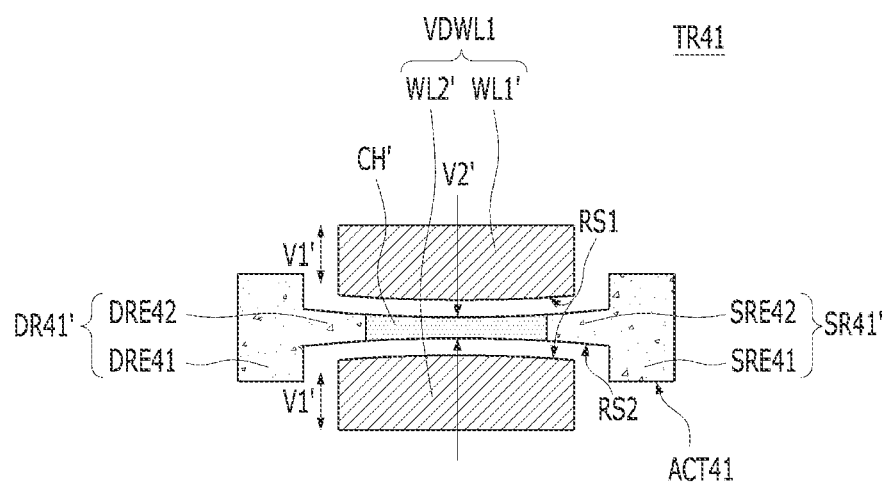
FIG. 8D is a modified example of a transistor TR40.
Figure 8D:
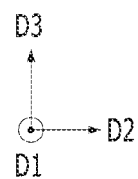

FIG. 8D illustrates a modified example of the transistor TR40.

Referring to FIG. 8D, a transistor TR41 may include an active layer ACT41 and a double word line VDWL1. The double word line VDWL1 may include a first word line WL1' and a second word line WL2' facing each other with the active layer ACT41 interposed therebetween. The active layer ACT 41 may include a thin-body channel CH', a first source/drain region SR41' on one side of the thin-body channel CH', and a second source/drain region DR41' on another side of the thin-body channel CH' which is opposite to the one side.

Each of the first and second word lines WL1' and WL2' of the double word line VDWL1 may include the first round surface RS1, and the active layer ACT21 may include the second round surfaces RS2. The first round surfaces RS1 and the second round surfaces RS2 may face each other. A gate dielectric layer may be formed between the double word line VDWL1 and the active layer ACT41. The second round surfaces RS2 may be formed on the second side region SRE42 of the first source/drain region SR41' and the second side region DRE42 of the second source/drain region DR41'. Surfaces of the first side region SRE41 of the first source/drain region SR41' and the first side region DRE41 of the second source/drain region DR41' may have a flat-shape.

Comparing thicknesses parallel to the first direction D1, the edge thickness V1' of the first word line WL1' and the second word line WL2' may be larger than the central thickness V2' of the thin-body channel CH'. An average thickness of the thin-body channel CH' may be smaller than an average thickness of the first word line WL1' and an average thickness of the second word line WL2'. The average thickness of the thin-body channel CH' may be equal to or less than 7 nm. An average thickness of the first source/drain region SR41' and an average thickness of the second source/drain region DR41' may be larger than the average thickness of the thin-body channel CH', but thinner than the average thickness of the first word line WL1' and the average thickness of the second word line WL2'. Here, the average thickness of a feature may refer to an average value between the thickest portion and the thinnest portion of the feature.

Figure 9:
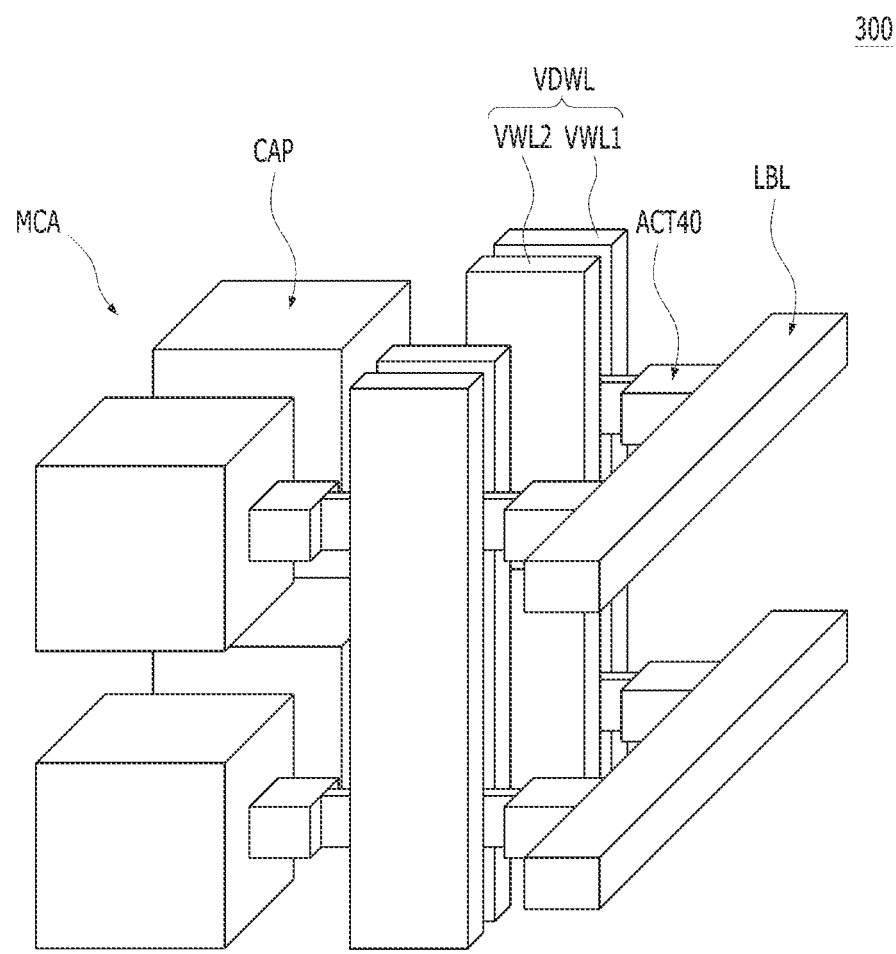
FIG. 9 is a schematic perspective view of a semiconductor memory device according to an embodiment of the present invention.

FIG. 9 is a schematic perspective view of a semiconductor memory device according to an embodiment of the present invention. Referring to FIGS. 8A and 9, the unit memory cell MC40 of FIG. 8A may be arranged in the first to third directions D1 to D3 and may configure the multi-layered memory cell array MCA. The memory cell array MCA may include a plurality of the memory cells MC40. Each of the plurality of memory cells MC40 may include a bit line LBL oriented laterally in the third direction D3, an active layer ACT40 laterally oriented in the second direction D2, a double word line DWL vertically oriented in the first direction D1, and capacitor CAP laterally oriented in the second direction D2. The memory cell array MCA of the unit memory cell MC40 may be similar to the memory cell array MCA of FIG. 3A. A semiconductor memory device including the memory cell array MCA of the unit memory cell MC40 may further include a peripheral circuit PERI. In an embodiment, the arrangement of the peripheral circuit PERI with the memory cell array MCA may be according to the COP structure shown in FIG. 3C. In another embodiment, the arrangement of the peripheral circuit PERI with the memory cell array MCA may be according to the POC structure shown in FIG. 4.

Figure 10A:
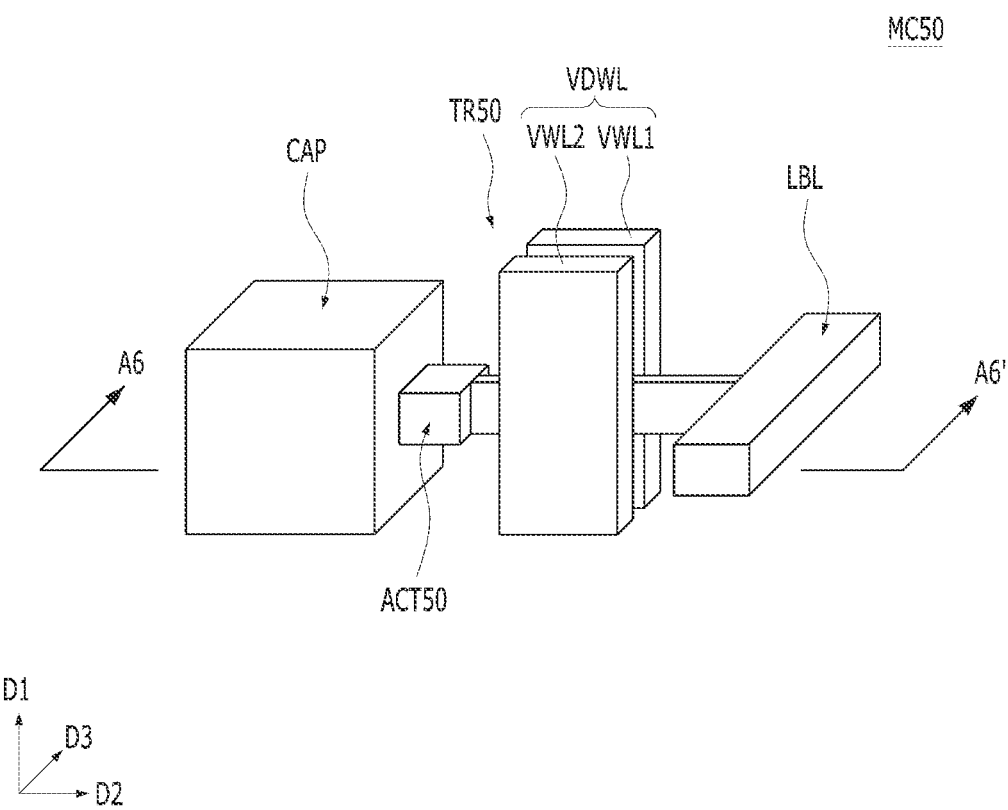
FIG. 10A is a schematic perspective view of a unit memory cell of a semiconductor memory device according to an embodiment of the present invention.
Figure 10B:
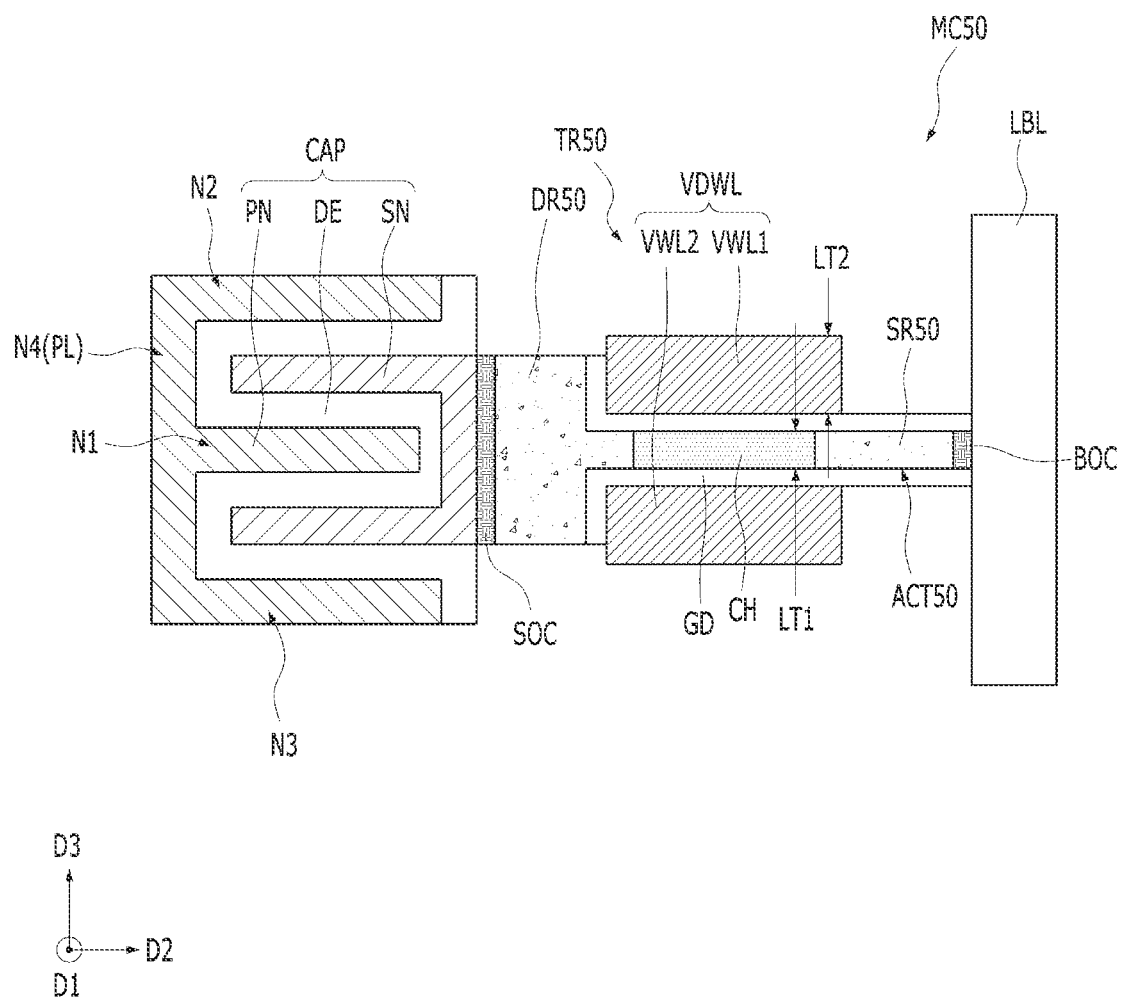
FIG. 10B is a cross-sectional view of the semiconductor memory device taken along a line A6-A6' of FIG. 10A.
Figure 10C:
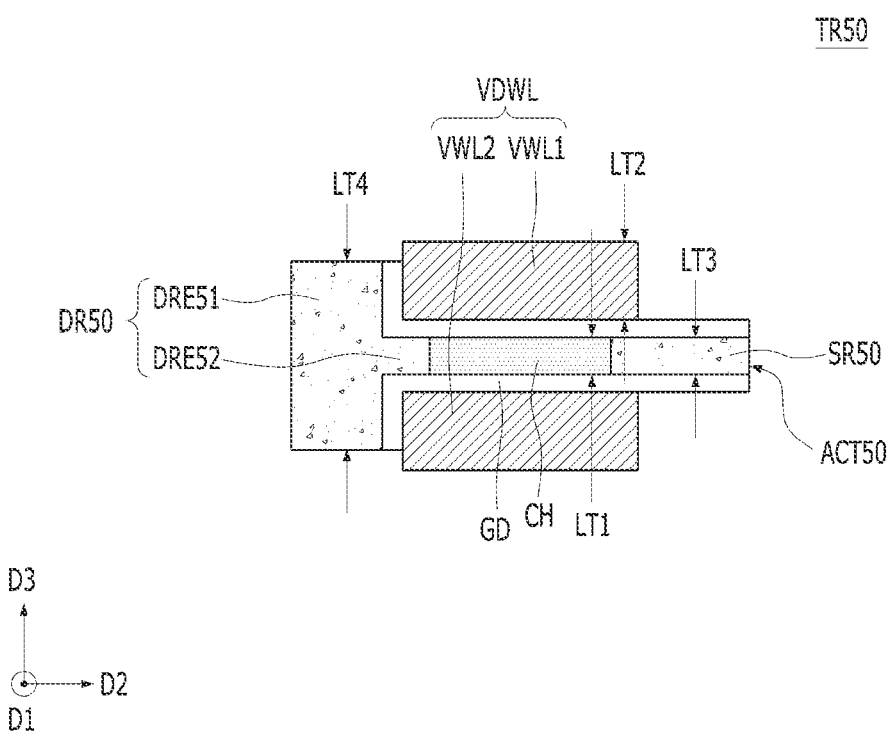
FIG. 10C is an enlarged view of a transistor.

FIG. 10A is a schematic perspective view of a unit memory cell of a semiconductor memory device according to an embodiment of the present invention. FIG. 10B is a cross-sectional view of the semiconductor memory device taken along a line A6-A6' of FIG. 10A. FIG. 10C is an enlarged view of a transistor. In FIGS. 10A to 10C, detailed description of duplicate components illustrated in FIGS. 1 to 9 may be omitted.

Referring to FIGS. 10A to 10C, a unit memory cell MC50 of a 3D semiconductor memory device may include a bit line LBL, a transistor TR50, and a capacitor CAP. The transistor TR50 may include an active layer ACT50, a gate dielectric layer GD, and a double word line VDWL. The capacitor CAP may include a storage node SN, a dielectric layer DE, and a plate node PN. The double word line VDWL may be vertically extended along the first direction D1. The active layer ACT50 may have a bar-shape extending in the second direction D2 intersecting with the first direction D1. The bit line LBL may have a line-shape extending in the third direction D3 intersecting with the first and second directions D1 and D2. The plate node PN of the capacitor CAP may be connected to the plate line PL.

The double word line VDWL may be vertically oriented along the first direction D1, the active layer ACT50 may be laterally oriented along the second direction D2, and the bit line LBL may be laterally oriented along the third direction D3.

The transistor TR50 may include the active layer ACT50, the gate dielectric layer GD, and the double word line VDWL. The double word line VDWL may extend in the first direction D1, and the active layer ACT50 may extend in the second direction D2. The active layer ACT50 may be laterally arranged from the bit line LBL. The double word line VDWL may include a first word line VWL1 and a second word line VWL2. The first word line VWL1 and the second word line VWL2 may face each other with the active layer ACT50 interposed therebetween. The gate dielectric layer GD may be formed on sides of the active layer ACT50. Here, the sides of the active layer ACT50 on which the gate dielectric layer GD is formed may be the ones which are parallel with the first direction D1.

The active layer ACT50 may include a thin-body channel CH, a first source/drain region SR50 between the thin-body channel CH and the bit line LBL, and a second source/drain region DR50 between the thin-body channel CH and the capacitor CAP. A first side of the first source/drain region SR50 may be in contact with the bit line LBL. A second side of the first source/drain region SR50 may be in contact with the thin-body channel CH. A first side of the second source/drain region DR50 may be in contact with the storage node SN. A second side of the second source/drain region DR50 may be in contact with the thin-body channel CH. Each of the second sides of the first and second source/drain regions SR40 and DR40 may partially overlap with sides of the first and second word lines VWL1 and VWL2. A bit line side-ohmic contact BOC may be formed between the first source/drain region SR50 and the bit line LBL. The bit line side-ohmic contact BOC may be formed by a reaction between a metal of the bit line BL and the silicon of the first source/drain region SR50. The bit line side-ohmic contact BOC may include metal silicide and may be formed on an edge of the active layer ACT50, which is the first side of the first source/drain region SR50. A storage node side-ohmic contact SOC may be formed between the second source/drain region DR50 and the storage node SN. The storage node side-ohmic contact SOC may include metal silicide and may be formed on another edge of the active layer ACT50, which is the first side of the second source/drain region DR50. The storage node side-ohmic contact SOC may be formed by a reaction between a metal of the storage node SN and the silicon of the second source/drain region DR50.

A lateral thickness LT1 of the thin-body channel CH may be smaller than a lateral thickness LT2 of the first and second word lines VWL1 and VWL2 of the double word line VDWL. Here, the lateral thicknesses LT1 and LT2 may be measured in a direction parallel with the third direction D3.

Referring to FIG. 10C again, the first source/drain region SR50 may have a bar-shape. A lateral thickness LT3 of the first source/drain region SR50 may be equal to the lateral thickness LT1 of the thin-body cannel CH. The second source/drain region DR50 may include a first side region DRE51 and a second side region DRE52. A lateral thickness LT4 of the first side region DRE51 of the second source/drain region DR50 may be larger than the lateral thickness LT1 of the second side region DRE52. The lateral thickness LT4 of the first side region DRE51 of the second source/drain region DR50 may be larger than the lateral thickness LT1 of the thin-body channel CH. The lateral thickness LT3 of the first source/drain region SR50 and the lateral thickness of the second side region DRE52 of the second source/drain region DR50 may be equal to the lateral thickness LT1 of the thin-body channel CH. The lateral thickness LT1 of the thin-body channel CH may be smaller than the lateral thickness LT2 of the first and second word lines VWL1 and VWL2 of the double word line VDWL.

Figure 11A:
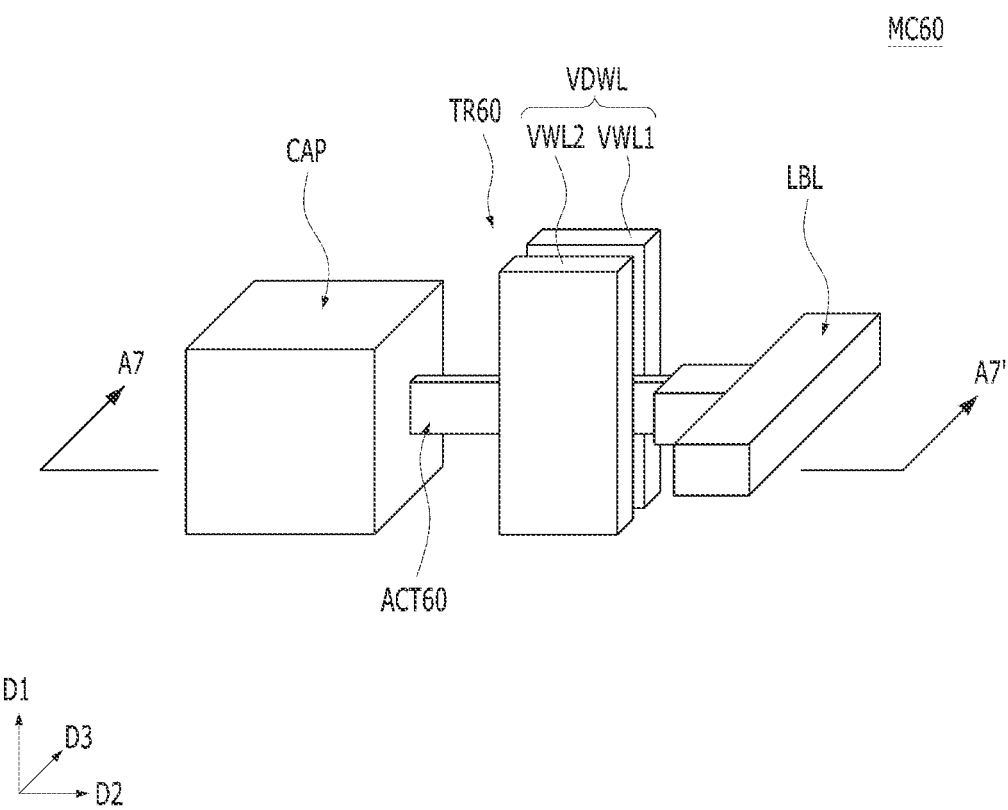
FIG. 11A is a schematic perspective view of a unit memory cell of a semiconductor memory device according to an embodiment of the present invention.
Figure 11B:
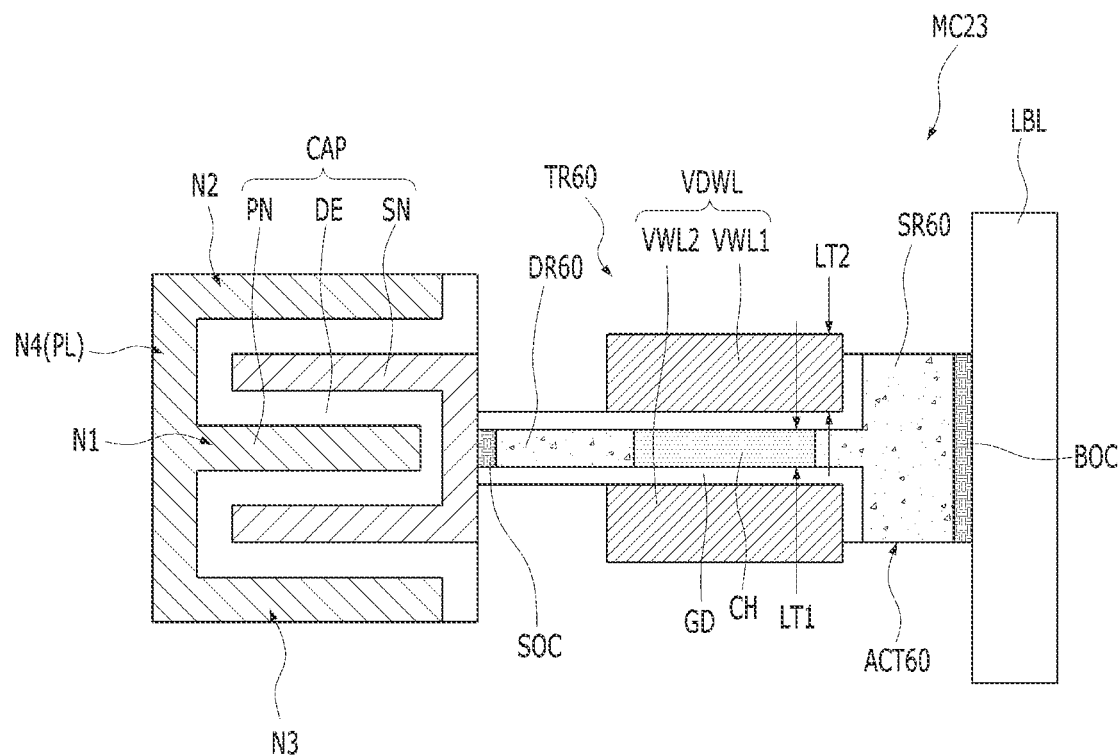
FIG. 11B is a cross-sectional view of the semiconductor memory device taken along a line A7-A7' of FIG. 11A.
Figure 11C:
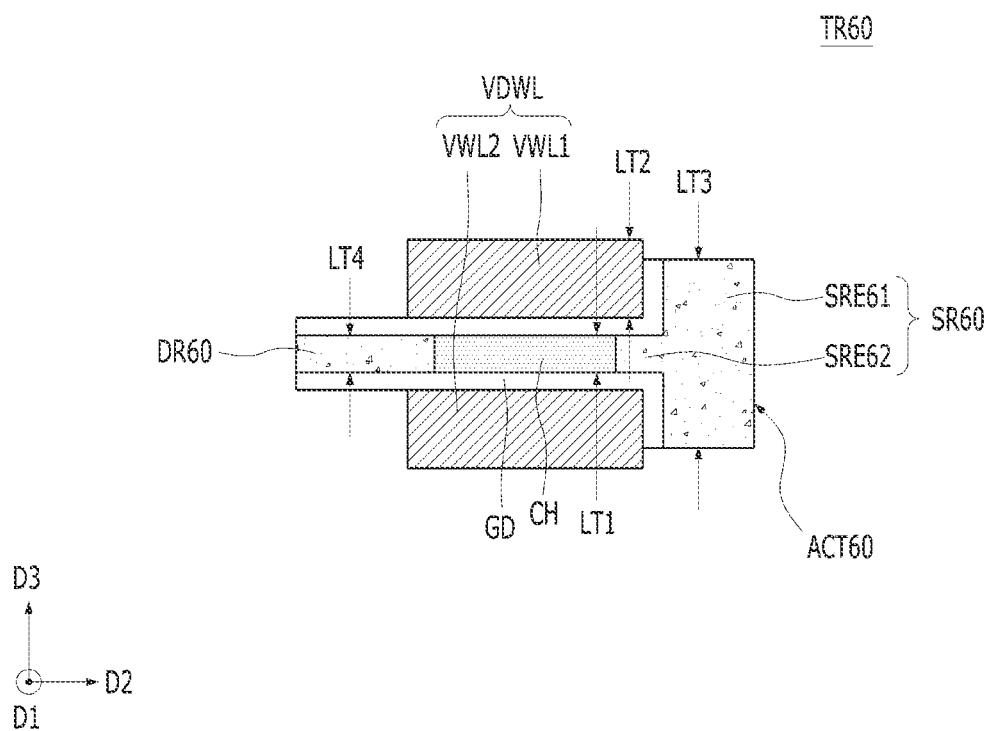
FIG. 11C is an enlarged view of a transistor.

FIG. 11A is a schematic perspective view of a unit memory cell of a semiconductor memory device according to an embodiment of the present invention. FIG. 11B is a cross-sectional view of the semiconductor memory device taken along a line A7-A7' of FIG. 11A. FIG. 11C is an enlarged view of a transistor. In FIGS. 11A to 11C, detailed description of duplicate components illustrated in FIGS. 1 to 10C may be omitted.

Referring to FIGS. 11A to 11C, a unit memory cell MC60 of a 3D semiconductor memory device may include a bit line LBL, a transistor TR60, and a capacitor CAP. The transistor TR60 may include an active layer ACT60, a gate dielectric layer GD, and a double word line VDWL. The capacitor CAP may include a storage node SN, a dielectric layer DE, and a plate node PN. The double word line VDWL may vertically extend along the first direction D1. The active layer ACT60 may have a bar-shape extending in the second direction D2 intersecting with the first direction D1. The bit line LBL may have a line-shape extending in the third direction D3 intersecting with the first and second directions D1 and D2. The plate node PN of the capacitor CAP may be connected to the plate line PL.

The double word line VDWL may be vertically oriented along the first direction D1, the active layer ACT60 may be laterally oriented along the second direction D2, and the bit line LBL may be laterally oriented along the third direction D3.

The transistor TR60 may include the active layer ACT60, the gate dielectric layer GD, and the double word line VDWL. The double word line VDWL may extend in the first direction D1, and the active layer ACT60 may extend in the second direction D2. The active layer ACT60 may be laterally arranged from the bit line LBL. The double word line VDWL may include a first word line VWL1 and a second word line VWL2. The first word line VWL1 and the second word line VWL2 may face each other with the active layer ACT60 interposed therebetween. The gate dielectric layer GD may be formed on sides of the active layer ACT60.

Here, the sides of the active layer ACT60 on which the gate dielectric GD may be formed are parallel with the first direction D1.

The active layer ACT60 may include a thin-body channel CH, a first source/drain region SR60 between the thin-body channel CH and the bit line LBL, and a second source/drain region DR60 between the thin-body channel CH and the capacitor CAP. A first side of the first source/drain region SR60 may be in contact with the bit line LBL. A second side of the first source/drain region SR60 may be in contact with the thin-body channel CH. A first side of the second source/drain region DR60 may be in contact with the storage node SN. A second side of the second source/drain region DR60 may be in contact with the thin-body channel CH. Each of the second sides of the first and second source/drain regions SR60 and DR60 may partially overlap with sides of the first and second word lines VWL1 and VWL2. A bit line side-ohmic contact BOC may be formed between the first source/drain region SR60 and the bit line LBL. The bit line side-ohmic contact BOC may be formed by a reaction between a metal of the bit line BL and the silicon of the first source/drain region SR60. The bit line side-ohmic contact BOC may include metal silicide and may be formed on an edge of the active layer ACT60, which is the first side of the first source/drain region SR60. A storage node side-ohmic contact SOC may be formed between the second source/drain region DR60 and the storage node SN. The storage node side-ohmic contact SOC may include metal silicide and may be formed on another edge of the active layer ACT60, which is the first side of the second source/drain region DR60. The storage node side-ohmic contact SOC may be formed by a reaction between a metal of the storage node SN and the silicon of the second source/drain region DR60.

A lateral thickness LT1 of the thin-body channel CH may be smaller than a lateral thickness LT2 of the first and second word lines VWL1 and VWL2 of the double word line VDWL. Here, the lateral thicknesses LT1 and LT2 may be measured in a direction parallel with the third direction D3.

Referring to FIG. 11C again, the second source/drain region DR60 may have a bar-shape. A lateral thickness LT4 of the second source/drain region DR 60 may be equal to the lateral thickness LT1 of the thin-body cannel CH. The first source/drain region SR60 may include a first side region SRE61 and a second side region SRE62. A lateral thickness LT3 of the first side region SRE61 of the first source/drain region SR60 may be larger than the lateral thickness LT1 of the second side region SRE62. The lateral thickness LT3 of the first side region SRE61 of the first source/drain region SR60 may be larger than the lateral thickness LT1 of the thin-body channel CH. The lateral thickness LT3 of the first source/drain region SR60 and the lateral thickness LT4 of the second source/drain region DR60 may be equal to the lateral thickness LT1 of the thin-body channel CH. The lateral thickness LT1 of the thin-body channel CH may be smaller than the lateral thickness LT2 of the first and second word lines VWL1 and VWL2 of the double word line VDWL.

As referred in FIGS. 5D, 6D, and 8D, the thin-body channels and the double word lines may have round surfaces according to FIGS. 10A to 11C. The round surfaces of the thin-body channels and the round surfaces of the double word lines may face each other.

A transistor having the thin-body channel according to embodiments of the present invention described above may be applied to a double gate field effect transistor, a Fin field effect transistor (FinFET), a gate all around field effect transistor, and a multi bridge thin-body channel field effect transistor.

Although the disclosure is shown and described with reference to specific embodiments thereof, the present invention is not limited thereto. It will readily be appreciated by one of ordinary skill in the art that various changes or modifications may be made thereto without departing from the scope of the disclosure.

What is claimed is:

1. A semiconductor memory device, comprising:
a substrate;
an active layer spaced apart from the substrate, extending in a direction parallel to the substrate, and including a thin-body channel;
a bit line extending in a direction vertical to the substrate and connected to one side of the active layer;
a capacitor connected to another side of the active layer;
a first word line and a second word line extending in a direction crossing the thin-body channel with the thin-body channel interposed therebetween,
a bit line contact node disposed between one side of the active layer and the bit line;
a bit line side-ohmic contact disposed between the bit line contact node and the bit line;
a storage contact node disposed between another side of the active layer and the capacitor; and
a storage node side-ohmic contact disposed between the storage contact node and the capacitor,
wherein a thickness of the thin-body channel is smaller than thicknesses of the first word line and the second word line.

2. The semiconductor memory device of claim 1, wherein the active layer further includes a first source/drain region connected to the bit line and a second source/drain region connected to the capacitor, and
the first source/drain region and the second source/drain region are positioned at both sides of the thin-body channel.

3. The semiconductor memory device of claim 2, wherein the thickness of the thin-body channel is smaller than a thickness of each the first and second source/drain regions.

4. The semiconductor memory device of claim 2, wherein the thickness of the thin-body channel is smaller than that of the second source/drain region, and
the thickness of the thin-body channel is equal to that of the first source/drain region.

5. The semiconductor memory device of claim 1, wherein the thin-body channel includes a semiconductor material or an oxide semiconductor material.

6. The semiconductor memory device of claim 1, wherein the thin-body channel includes silicon, germanium, silicon-germanium, or indium gallium zinc oxide (IGZO).

7. The semiconductor memory device of claim 1, further including a word line pad, the word line pad interconnecting the first word line and the second word line.

8. The semiconductor memory device of claim 1, wherein edge portions of the first word line and the second word line have a step-shape along a direction vertical to the substrate.

9. The semiconductor memory device of claim 1, wherein each of the bit line contact node and the storage contact node includes polysilicon.

10. The semiconductor memory device of claim 1, wherein each of the bit line side-ohmic contact and the storage node side-ohmic contact includes metal silicide.

11. The semiconductor memory device of claim 1, wherein the capacitor includes a cylinder-type storage node, the cylinder-type storage node being connected to the another side of the active layer.

12. A semiconductor memory device, comprising:
a substrate;
an active layer spaced apart from the substrate, extending in a direction parallel to the substrate, and including a first source/drain region, a second source/drain region and a thin-body channel between the first source/drain region and the second source/drain region;
a bit line extending in a direction vertical to the substrate and connected to the first source/drain region;
a capacitor connected to the second source/drain region; and
a first word line and a second word line extending in a direction crossing the thin-body channel with the thin-body channel interposed therebetween,
wherein a thickness of the thin-body channel is smaller than thicknesses of the first word line and the second word line, wherein
the thickness of the thin-body channel is smaller than that of first source/drain region, and
the thickness of the thin-body channel is equal to that of the second source/drain region.

13. A semiconductor memory device, comprising:
a substrate; and
a memory cell array including memory cells stacked along a direction vertical to the substrate,
wherein each of the memory cells comprises:
a bit line vertically oriented to the substrate;
a capacitor laterally spaced apart from the bit line;
an active layer laterally oriented between the bit line and the capacitor; and
a word line disposed on an upper portion of the active layer and laterally oriented to intersect with the active layer,
a bit line contact node disposed between one side of the active layer and the bit line;
a bit line side-ohmic contact disposed between the bit line contact node and the bit line;
a storage contact node disposed between another side of the active layer and the capacitor; and
a storage node side-ohmic contact disposed between the storage contact node and the capacitor,
wherein the active layer includes a thin-body channel, a thickness of the thin-body channel is smaller than a thickness of the word line.

14. The semiconductor memory device of claim 13, wherein
the word line includes first and second word lines, the first and second word lines crossing the thin-body channel with the thin-body channel interposed therebetween, and
a thickness of the thin-body channel is smaller than thicknesses of the first word line and the second word line.

15. The semiconductor memory device of claim 13, wherein the active layer further includes a first source/drain region connected to the bit line and a second source/drain region connected to the capacitor, and
the first source/drain region and the second source/drain region are positioned at both sides of the thin-body channel.

16. The semiconductor memory device of claim 15, wherein a thickness of the thin-body channel is smaller than a thickness of each of the first source/drain region and the second source/drain region.

17. The semiconductor memory device of claim 15, wherein
a thickness of the thin-body channel is smaller than that of the second source/drain region, and
the thickness of the thin-body channel is equal to that of the first source/drain region.

18. The semiconductor memory device of claim 13, wherein the thin-body channel includes a semiconductor material or an oxide semiconductor material.

19. The semiconductor memory device of claim 13, wherein word lines of the memory cells have a step-shape along a direction vertical to a surface of the substrate.

20. The semiconductor memory device of claim 13, wherein the memory cells include a dynamic random-access memory (DRAM) cell.

21. The semiconductor memory device of claim 13, wherein the substrate includes a peripheral circuit for controlling the memory cell array.

22. The semiconductor memory device of claim 21, wherein the peripheral circuit is disposed at a lower level or a higher level than the memory cell array.

23. A semiconductor memory device, comprising:
a substrate; and
a memory cell array including memory cells stacked along a direction vertical to the substrate,
wherein each of the memory cells comprises:
a bit line vertically oriented to the substrate;
a capacitor laterally spaced apart from the bit line;
an active layer laterally oriented between the bit line and the capacitor, and including a first source/drain region, a second source/drain region and a thin-body channel between the first source/drain region and the second source/drain region;
a word line disposed on an upper portion of the active layer and laterally oriented to intersect with the active layer,
wherein a thickness of the thin-body channel is smaller than a thickness of the word line, wherein
a thickness of the thin-body channel is smaller than that of first source/drain region, and
the thickness of the thin-body channel is equal to that of the second source/drain region.

* * * * *